(12) United States Patent
Yoon et al.

(10) Patent No.: US 12,733,320 B2
(45) Date of Patent: Sep. 8, 2026

(54) DISPLAY DEVICE COMPRISING SEMICONDUCTOR LIGHT-EMITTING DIODE

(71) Applicants: LG DISPLAY CO., LTD., Seoul (KR); LG ELECTRONICS INC., Seoul (KR)

(72) Inventors: Doohyun Yoon, Paju-si (KR); Hun Jang, Paju-si (KR); Sul Lee, Paju-si (KR); Hooyoung Song, Seoul (KR)

(73) Assignees: LG DISPLAY CO., LTD., Seoul (KR); LG ELECTRONICS INC., Seoul (KR)

( * ) Notice: Subject to any disclaimer, the term of this patent is extended or adjusted under 35 U.S.C. 154(b) by 428 days.

(21) Appl. No.: 18/285,190

(22) PCT Filed: Mar. 31, 2022

(86) PCT No.: PCT/KR2022/004644
§ 371 (c)(1),
(2) Date: Nov. 16, 2023

(87) PCT Pub. No.: WO2022/211546
PCT Pub. Date: Oct. 6, 2022

(65) Prior Publication Data

US 2024/0186472 A1 Jun. 6, 2024

(30) Foreign Application Priority Data

Mar. 31, 2021 (KR) ........................ 10-2021-0042251

(51) Int. Cl.
*H10H 20/857* (2025.01)
*H10D 86/00* (2025.01)
(Continued)

(52) U.S. Cl.
CPC ...... *H10H 20/857* (2025.01); *H10H 20/8312* (2025.01); *H10W 90/00* (2026.01)

(58) Field of Classification Search
CPC .. H10H 20/857; H10H 20/8312; H10H 29/03; H10H 29/0364; H10H 29/32;
(Continued)

(56) References Cited

U.S. PATENT DOCUMENTS

2006/0057293 A1 3/2006 Sharma et al.
2017/0069609 A1* 3/2017 Zhang .................. H01L 25/167
(Continued)

FOREIGN PATENT DOCUMENTS

KR 10-2018-0082003 A 7/2018
KR 10-1987196 B1 6/2019
(Continued)

OTHER PUBLICATIONS

International Search Report for PCT/KR2022/004644 mailed on Jul. 15, 2022.

*Primary Examiner* — Herve-Louis Y Assouman
(74) *Attorney, Agent, or Firm* — Birch, Stewart, Kolasch & Birch, LLP

(57) ABSTRACT

A display device including a semiconductor light emitting device according to an embodiment can include a substrate, first assembly wiring and second assembly wiring alternately arranged on the substrate and spaced apart from each other, a planarization layer disposed on the first assembly wiring and the second assembly wiring and having a first opening, and a light emitting device disposed inside the first opening, wherein the first electrode overlaps the plurality of first assembly wirings and the plurality of second assembly wirings. The first electrode may be electrically connected to one of the first assembly wiring and the second assembly wiring.

17 Claims, 19 Drawing Sheets

(51) Int. Cl.

| | |
|---|---|
| ***H10D 86/40*** | (2025.01) |
| ***H10D 86/60*** | (2025.01) |
| ***H10H 20/831*** | (2025.01) |
| ***H10H 29/32*** | (2025.01) |
| ***H10W 90/00*** | (2026.01) |

(58) Field of Classification Search
CPC ..... H10H 29/39; H10H 20/831; H10W 90/00; H10D 86/441; H10D 86/451; H10D 86/481; H10D 86/60; H10D 86/00; H01L 25/167; H01L 25/0753
See application file for complete search history.

(56) References Cited

U.S. PATENT DOCUMENTS

| | | | |
|---|---|---|---|
| 2017/0358563 | A1 | 12/2017 | Cho et al. |
| 2018/0190672 | A1 | 7/2018 | Lee et al. |
| 2018/0358339 | A1* | 12/2018 | Iguchi .................. H01L 25/167 |
| 2019/0051242 | A1* | 2/2019 | Lee ...................... G09G 3/3233 |
| 2020/0203321 | A1 | 6/2020 | Choi et al. |
| 2020/0328249 | A1 | 10/2020 | Chaji et al. |
| 2021/0066270 | A1 | 3/2021 | Hsieh et al. |
| 2022/0223575 | A1 | 7/2022 | Kim et al. |
| 2022/0293823 | A1 | 9/2022 | Chang et al. |
| 2022/0351993 | A1 | 11/2022 | Jeong et al. |
| 2023/0059135 | A1 | 2/2023 | Chang et al. |

FOREIGN PATENT DOCUMENTS

| | | | |
|---|---|---|---|
| KR | 10-2019-0075869 | A | 7/2019 |
| KR | 10-2019-0104276 | A | 9/2019 |
| KR | 10-2019-0143840 | A | 12/2019 |
| KR | 10-2020-0026681 | A | 3/2020 |
| KR | 10-2020-0026845 | A | 3/2020 |
| KR | 10-2020-0115868 | A | 10/2020 |
| KR | 10-2200046 | B1 | 1/2021 |

* cited by examiner

【FIG. 1】
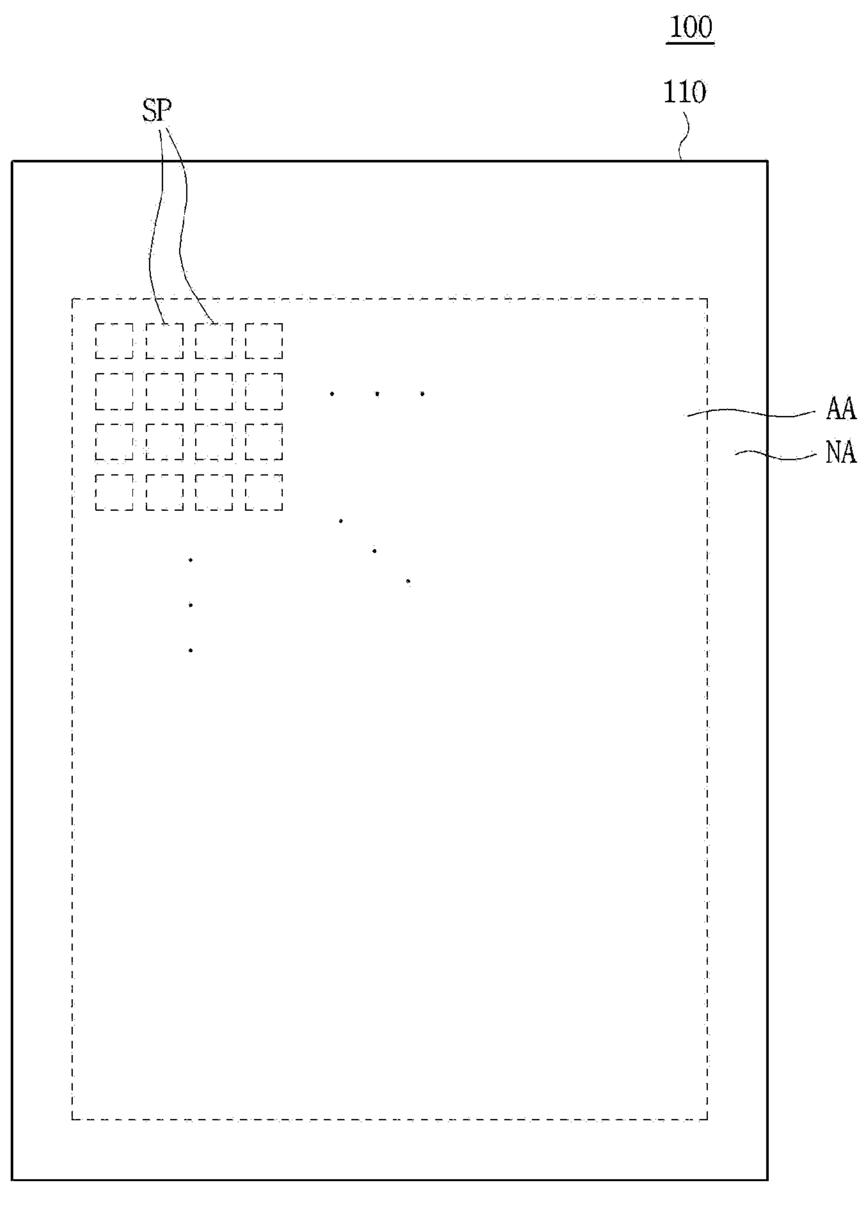

【FIG. 2】
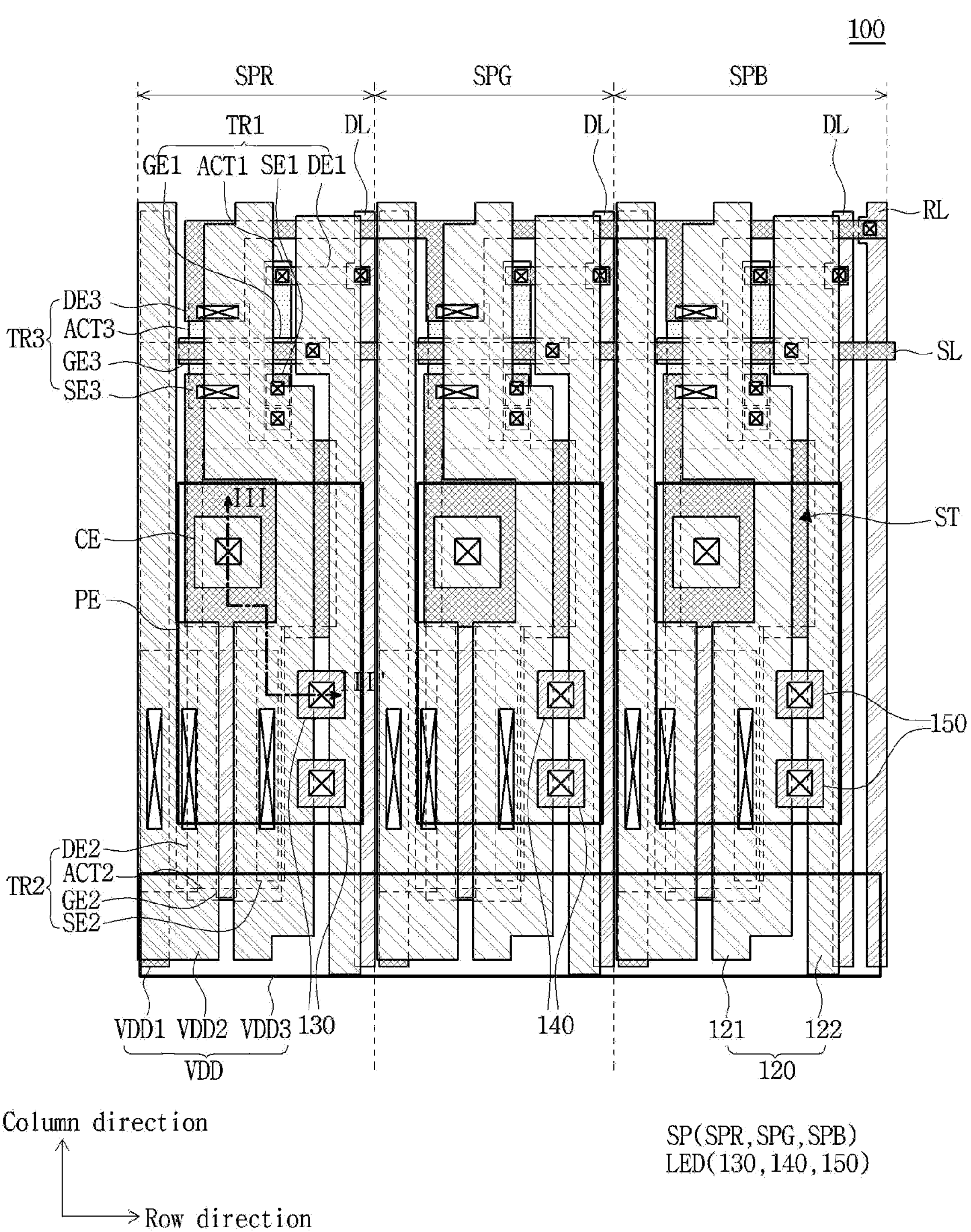

【FIG. 3】
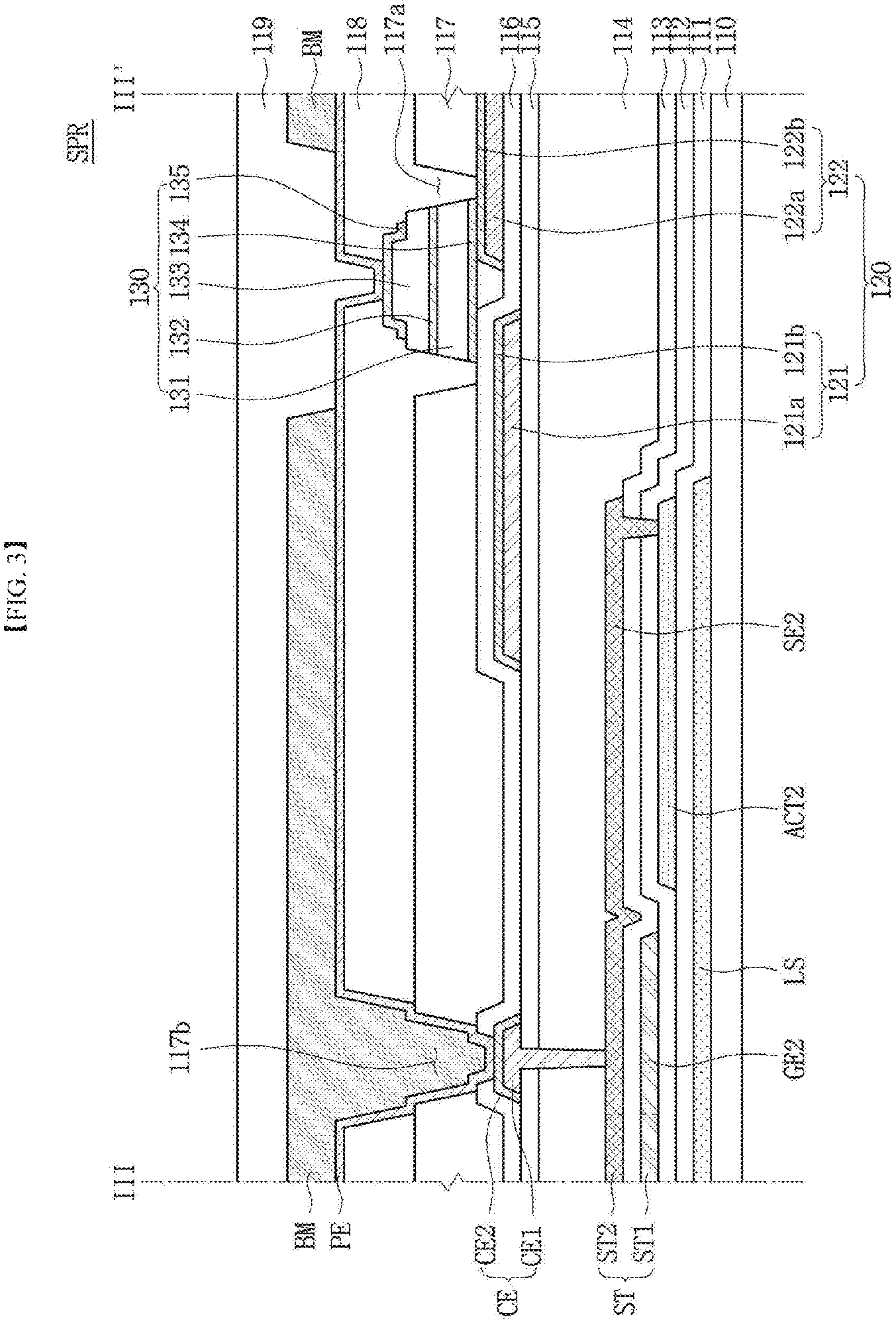

【FIG. 4A】
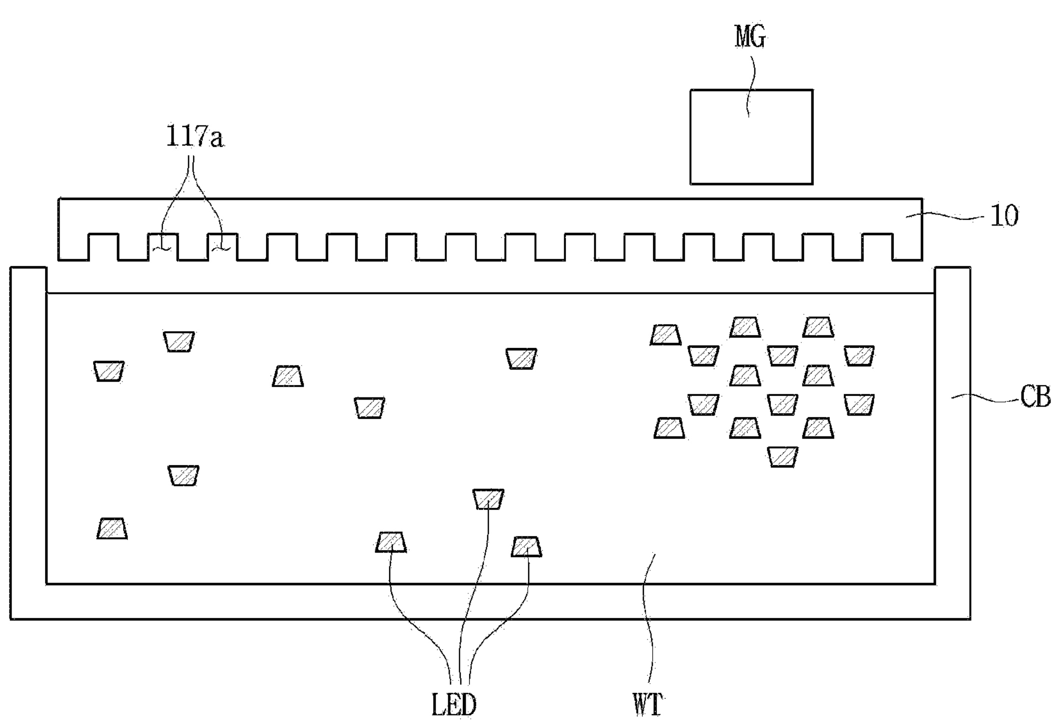

【FIG. 4B】
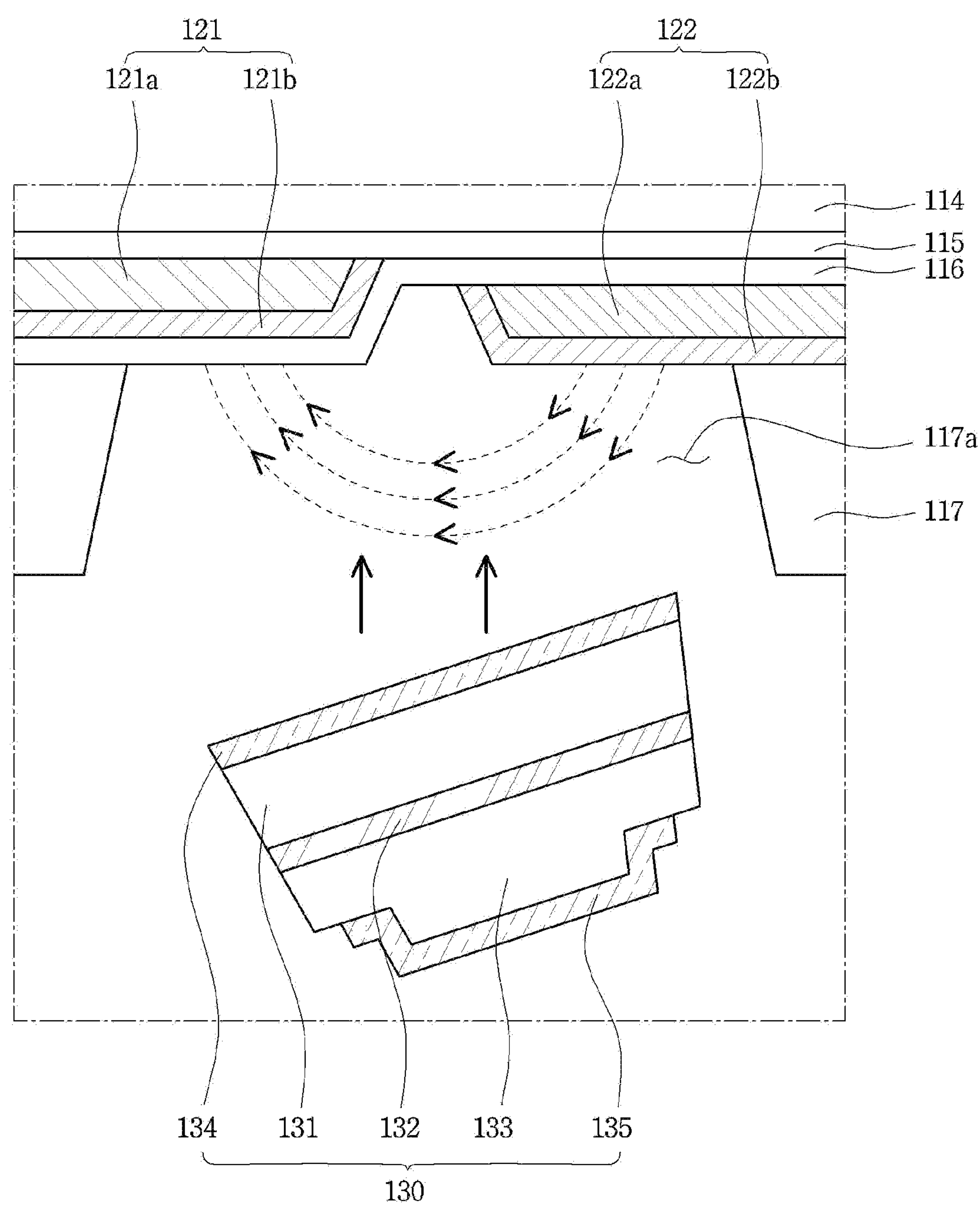

【FIG. 4C】
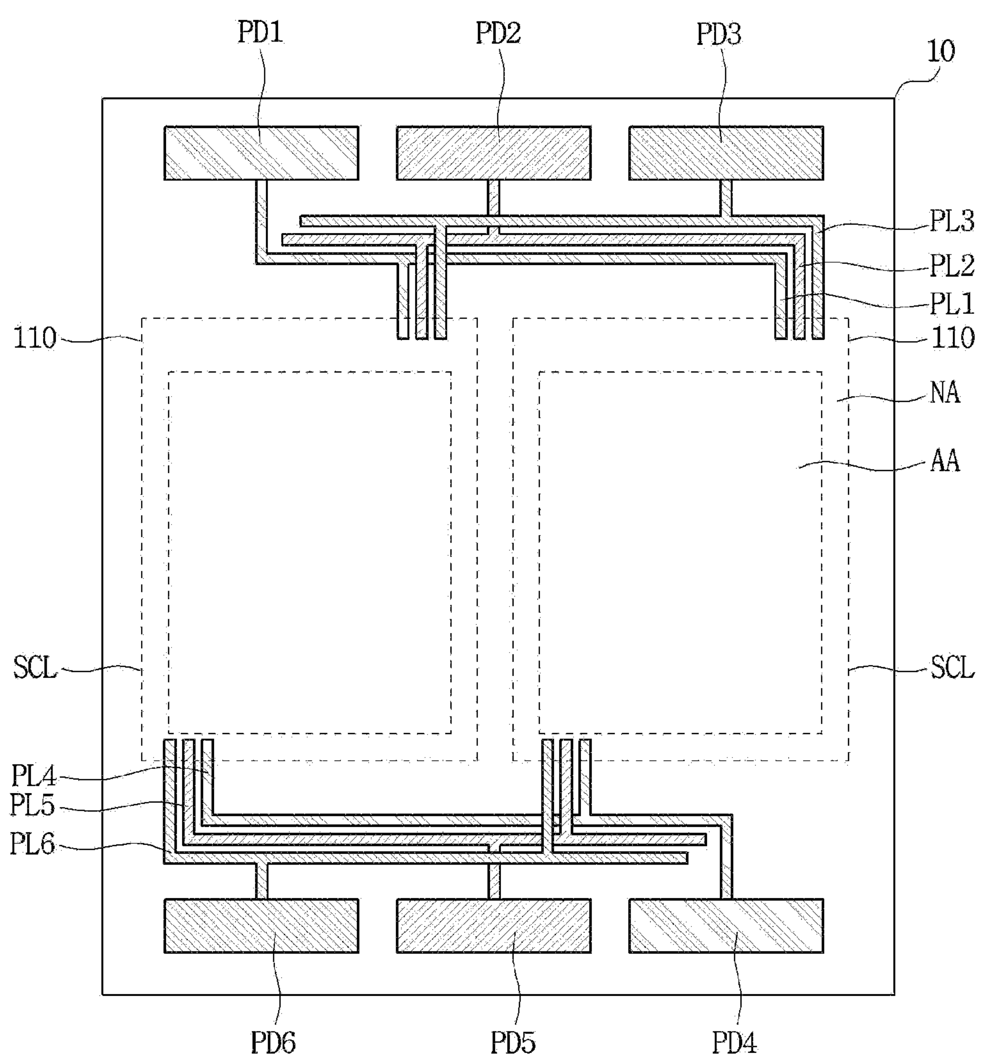
PD(PD1,PD2,PD3,PD4,PD5,PD6)
PL(PL1,PL2,PL3,PL4,PL5,PL6)

【FIG. 4D】
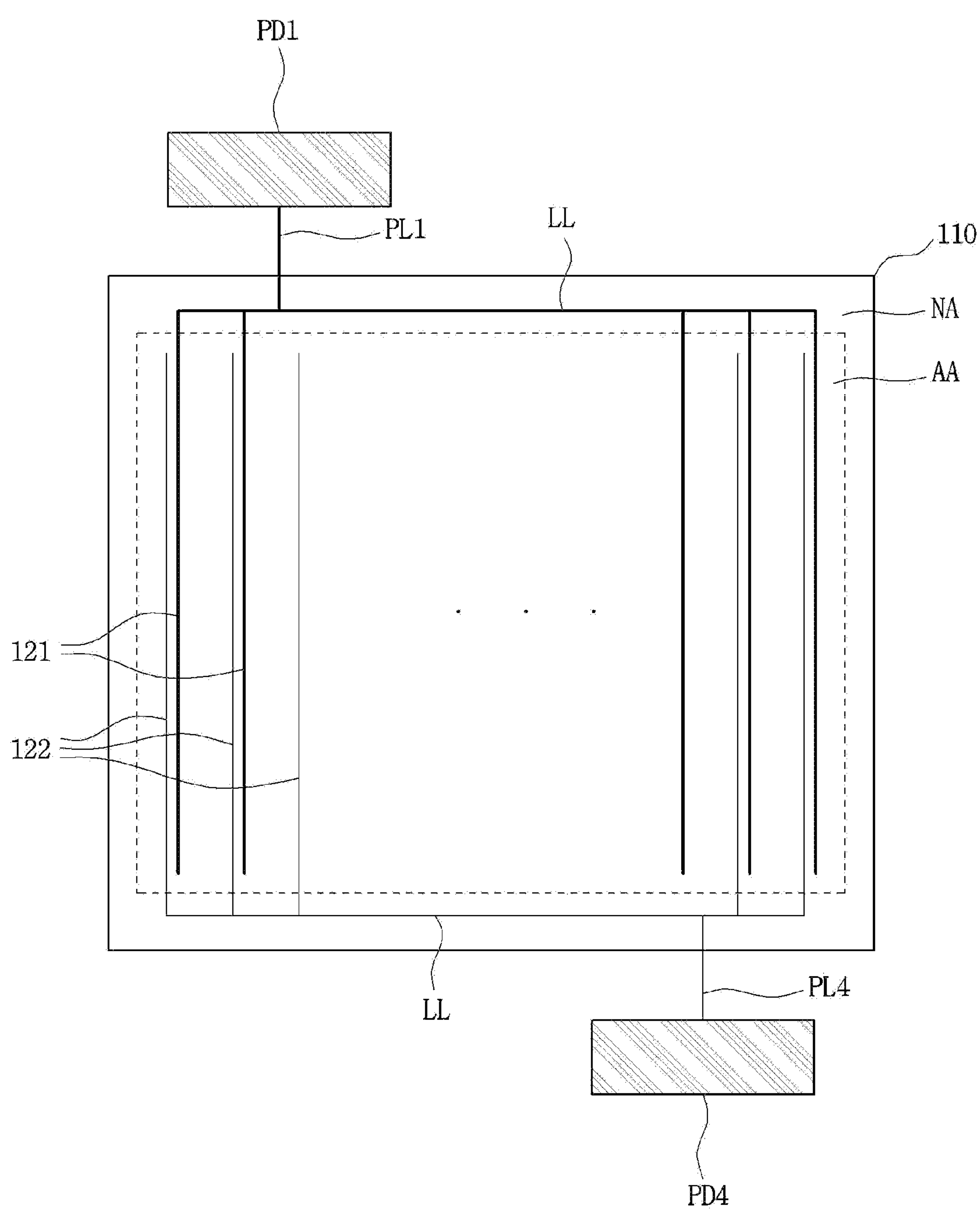

【FIG. 4E】
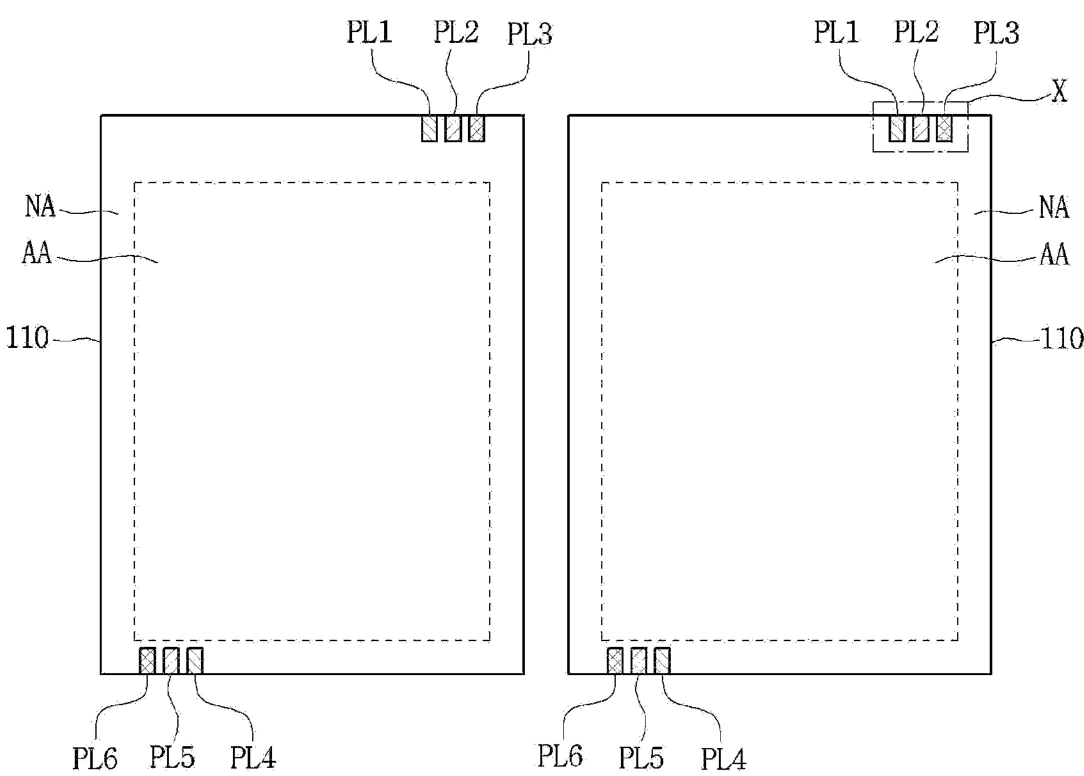

【FIG. 4F】
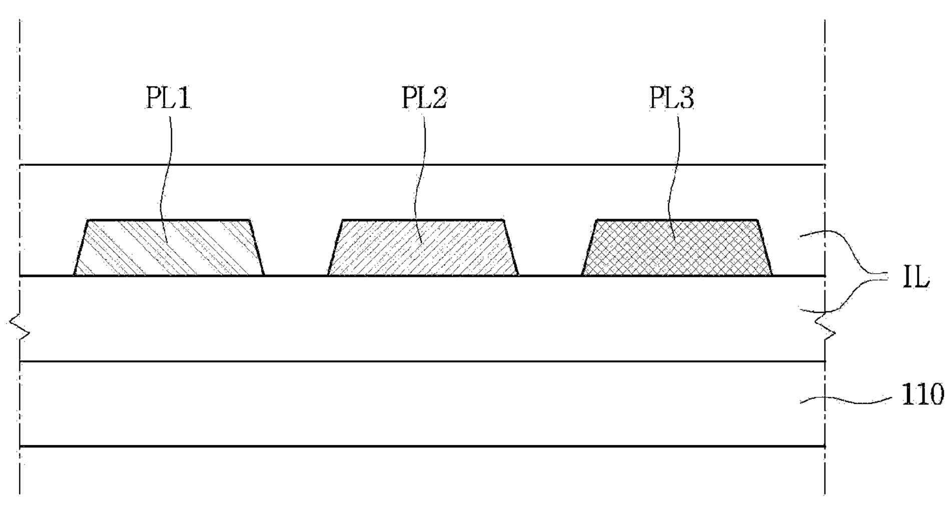

【FIG. 4G】
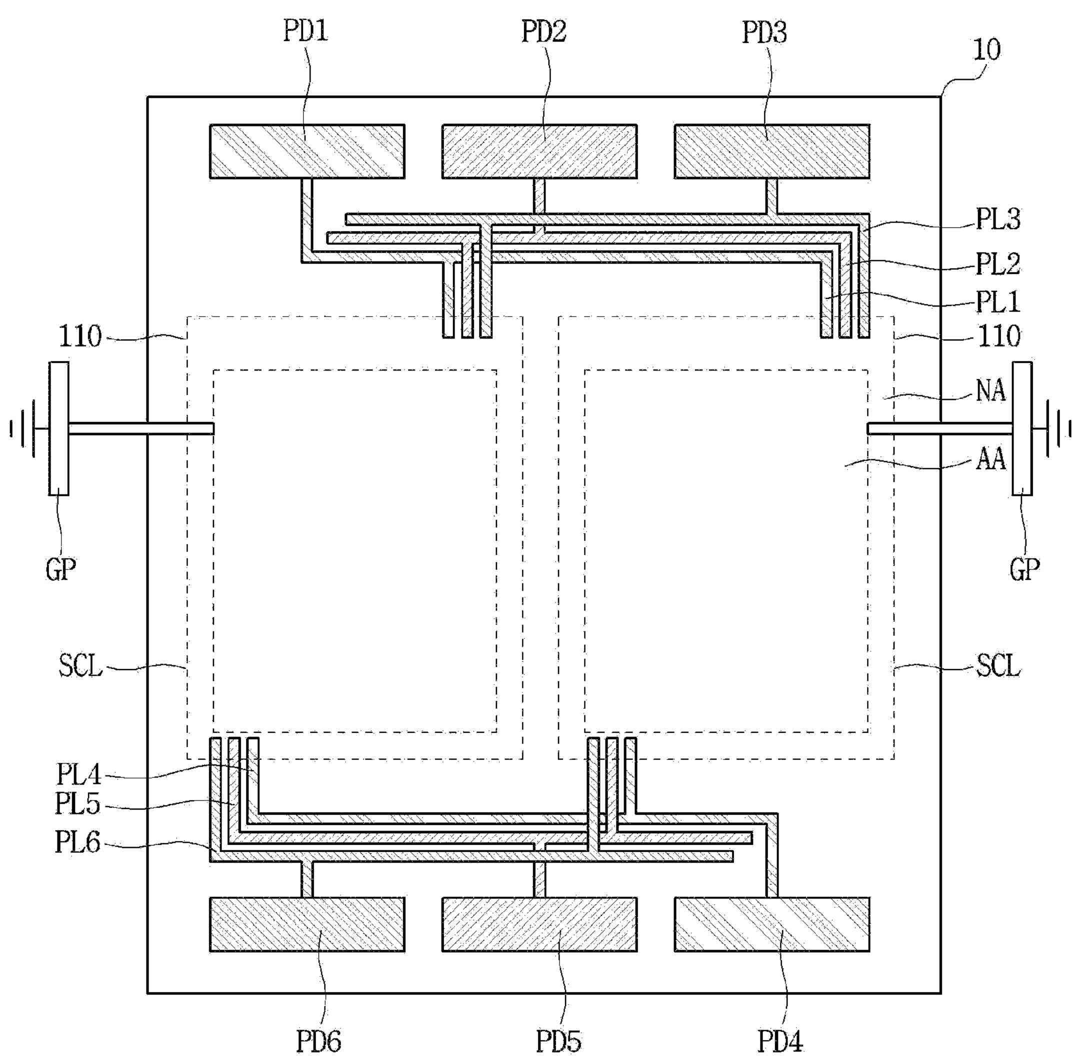

【FIG. 5】
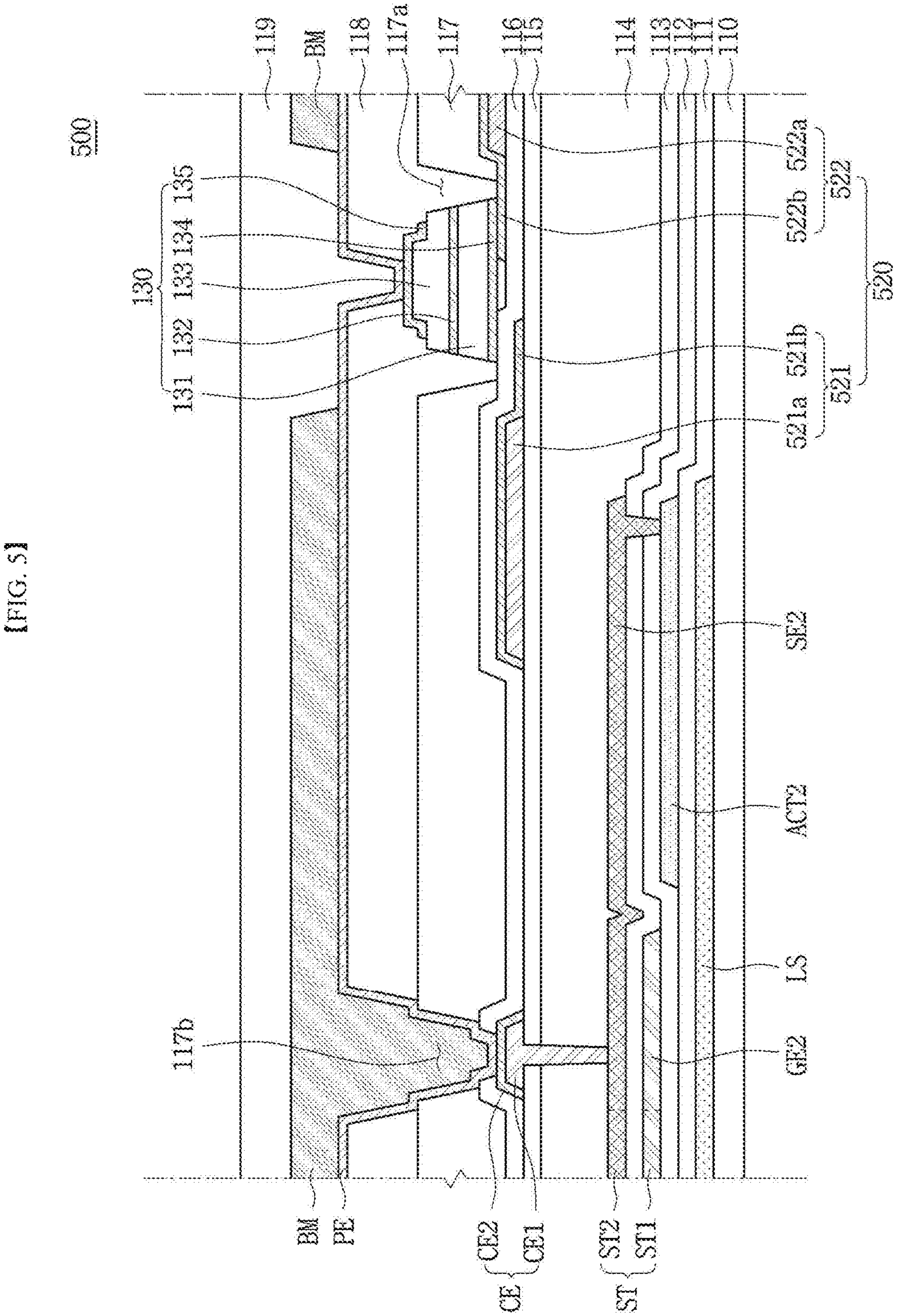

【FIG. 6】
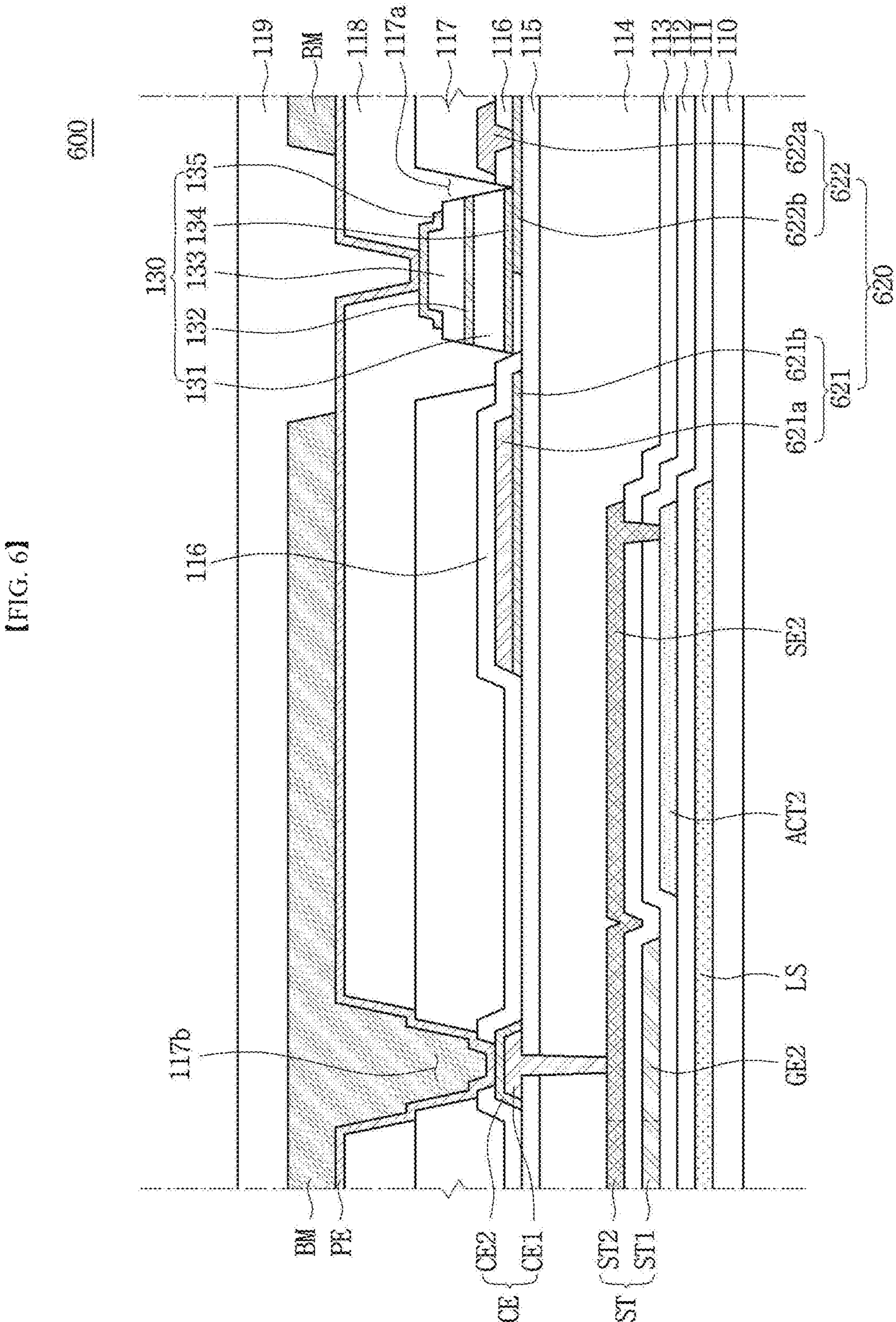

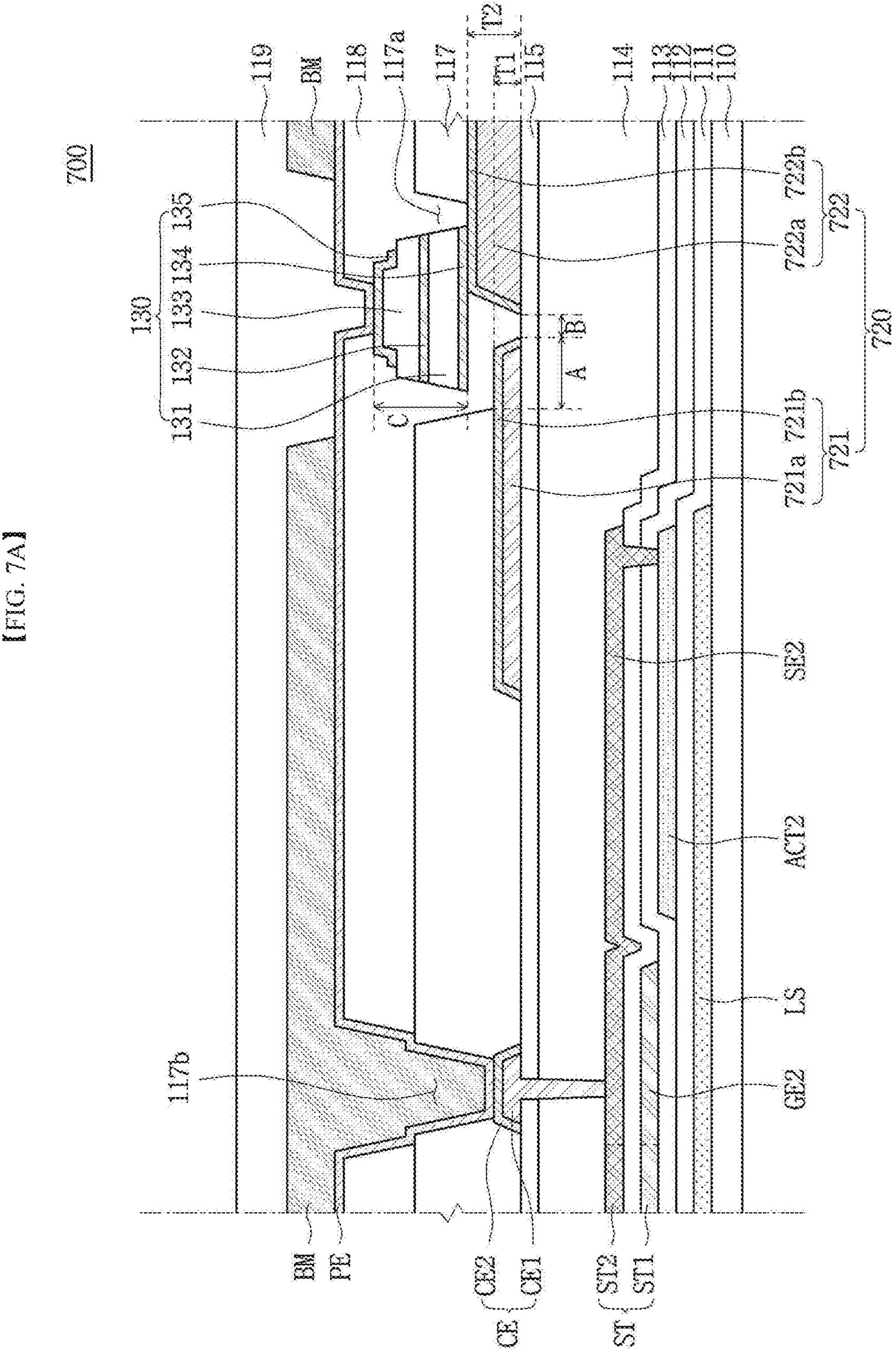
【FIG. 7A】
700
119
BM
118
117a
117
T2
T1
115
114
113
112
111
110
130
131
132
133
134
135
722b
722a
722
721b
721a
721
720
A
B
C
SE2
ACT2
LS
GE2
117b
BM
PE
CE2
CE1
CE
ST2
ST1
ST 【FIG. 7B】
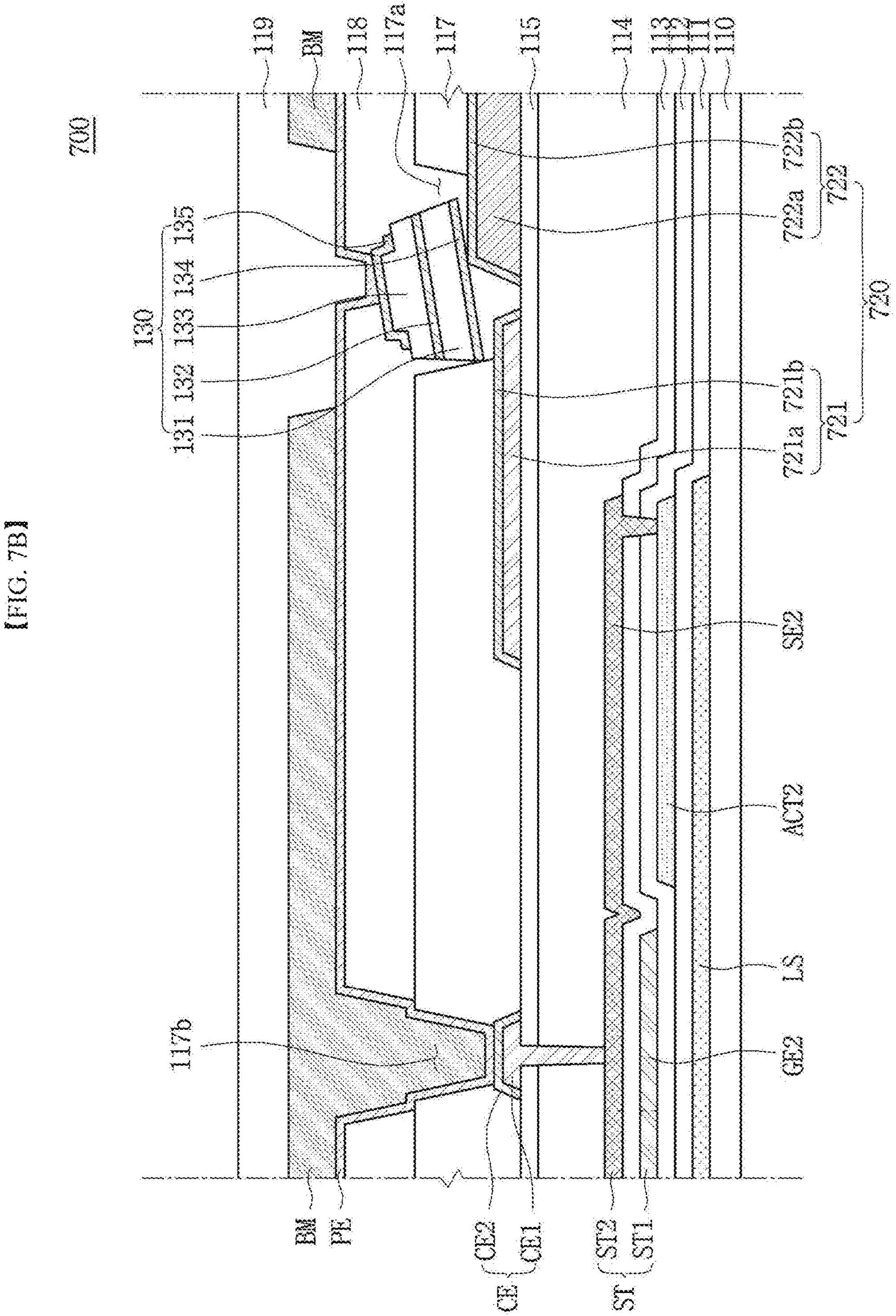

【FIG. 8A】
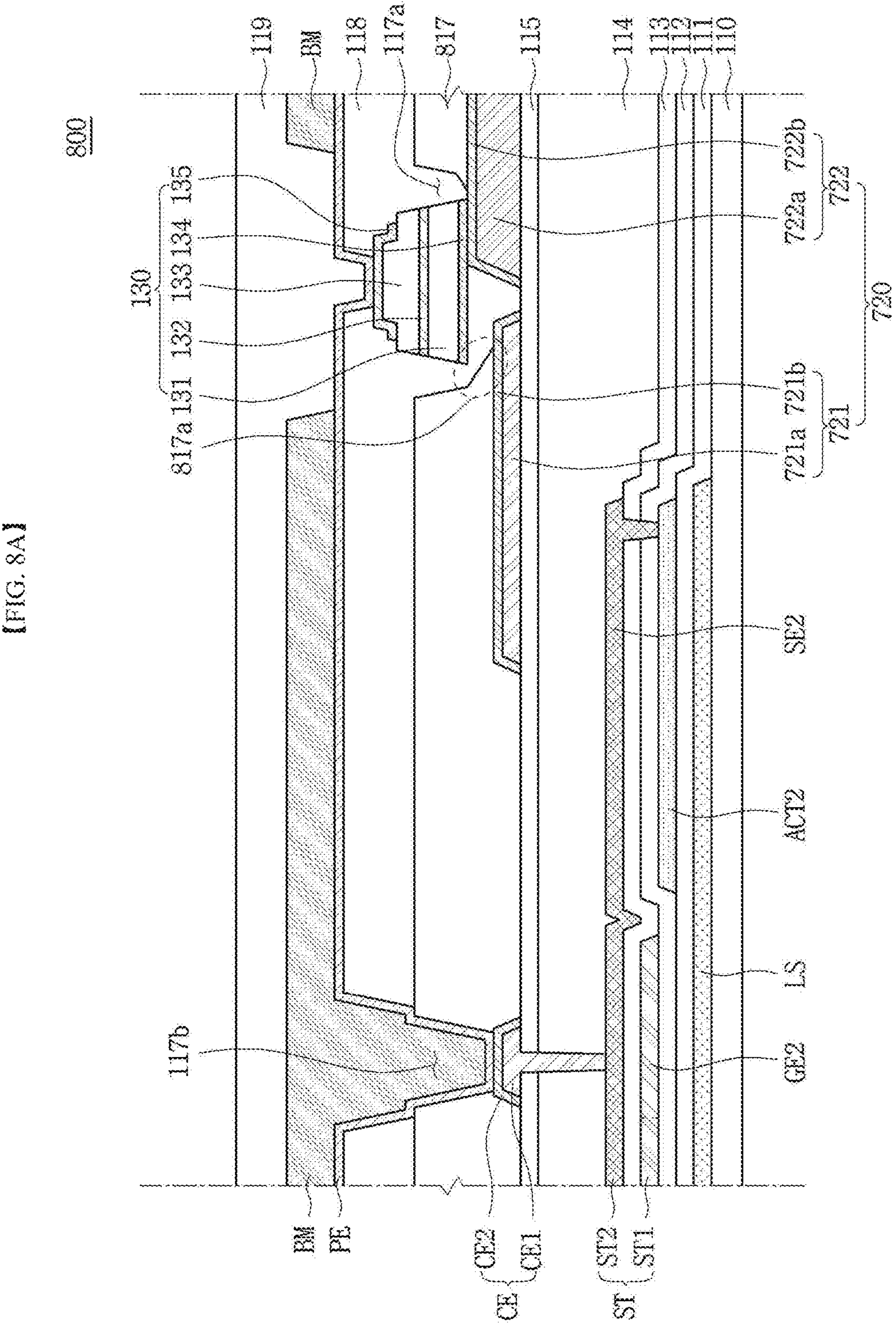

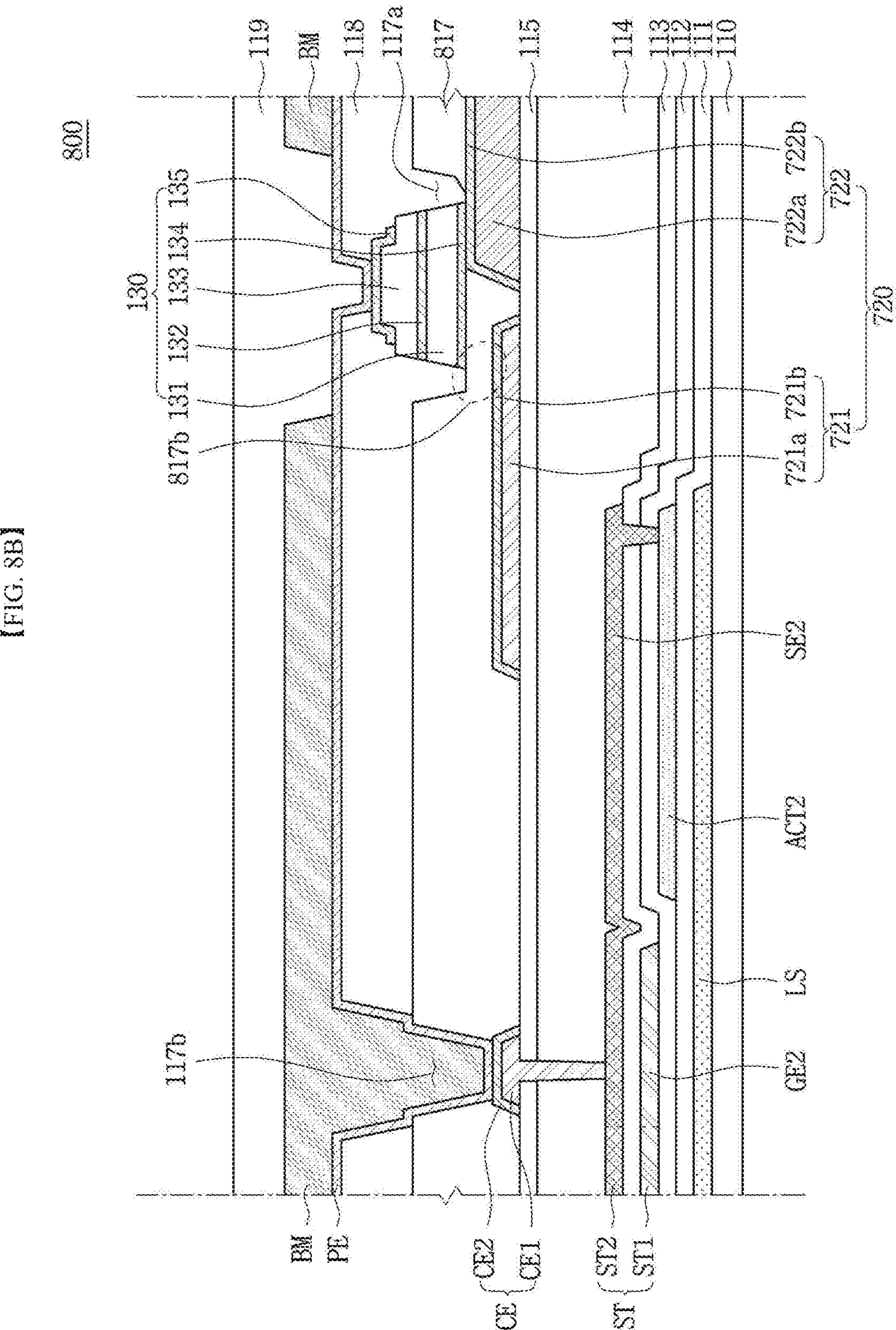
【FIG. 8B】
800
119
BM
118
117a
817
115
114
113
112
111
110
130
131
132
133
134
135
817b
722b
722a
722
720
721b
721a
721
SE2
ACT2
LS
GE2
117b
BM
PE
CE2
CE1
CE
ST2
ST1
ST

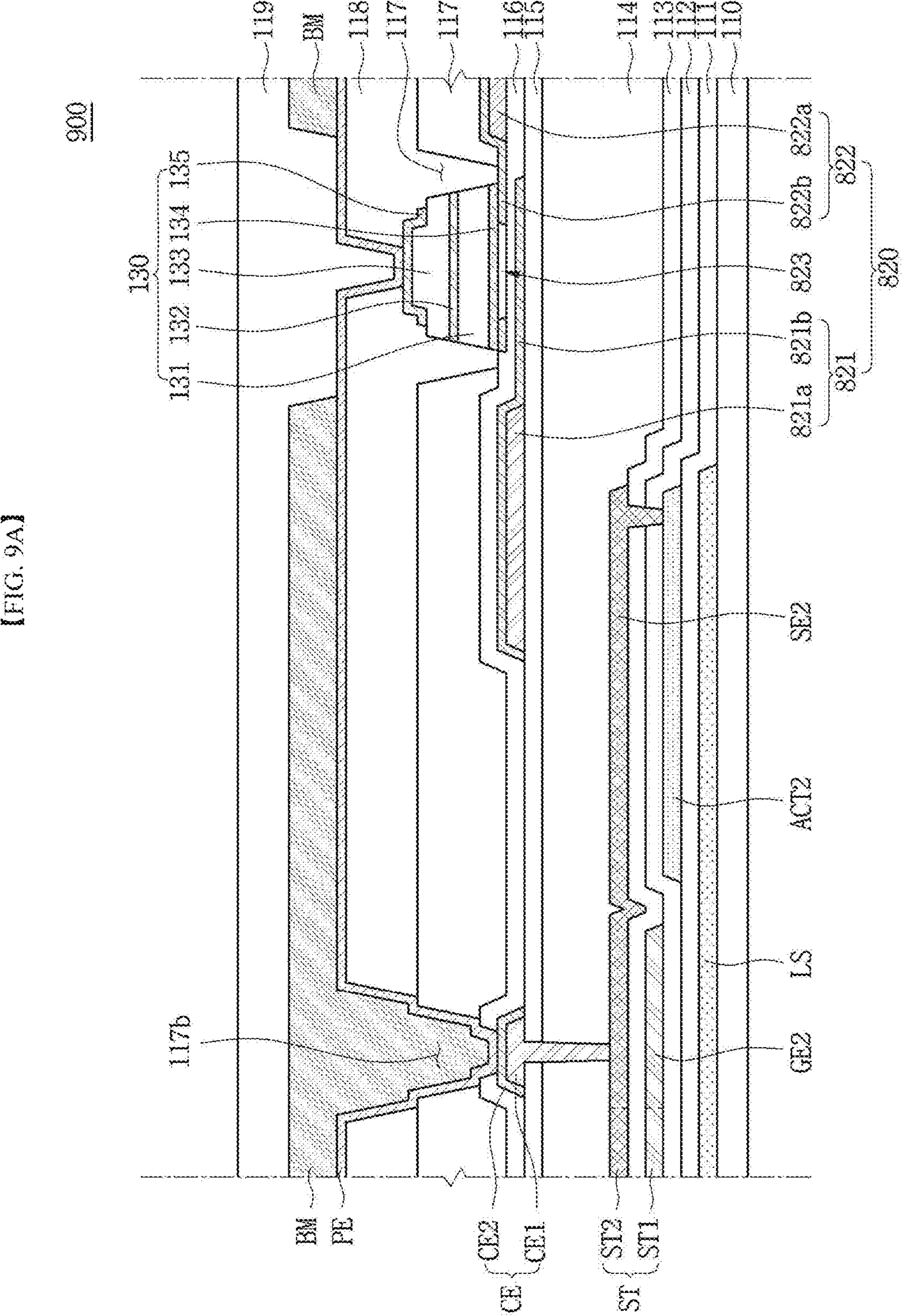
【FIG. 9A】
900
119
BM
118
117a
117
116
115
114
113
112
111
110
130
131
132
133
134
135
822a
822b
822
823
821b
821a
821
820
SE2
ACT2
LS
GE2
117b
BM
PE
CE2
CE1
CE
ST2
ST1
ST

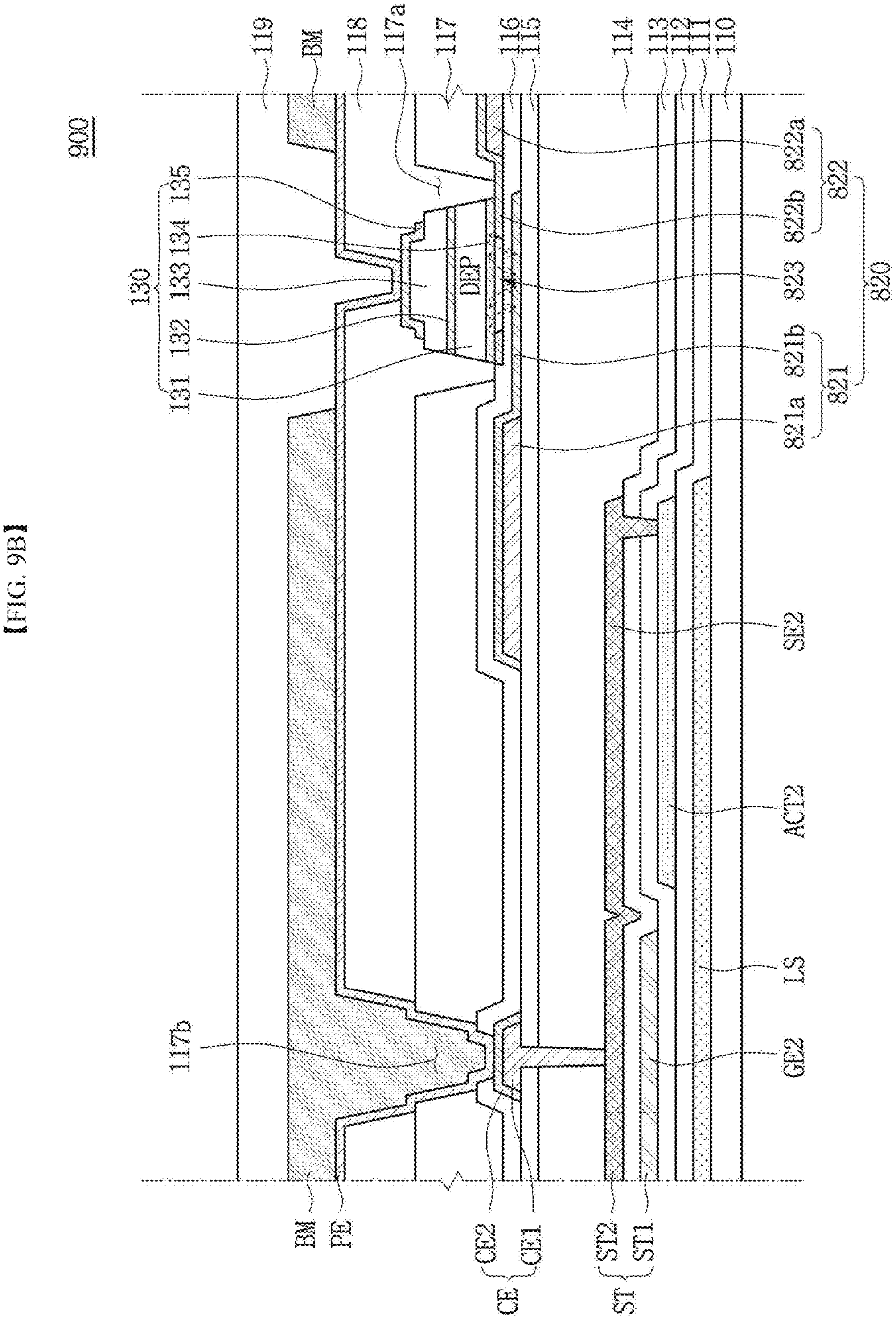
【FIG. 9B】
900
119
BM
118
117a
117
116
115
114
113
112
111
110
130
131
132
133
134
135
DEP
822a
822b
822
823
821b
821a
821
820
SE2
ACT2
LS
GE2
117b
BM
PE
CE2
CE1
CE
ST2
ST1
ST 【FIG. 10】
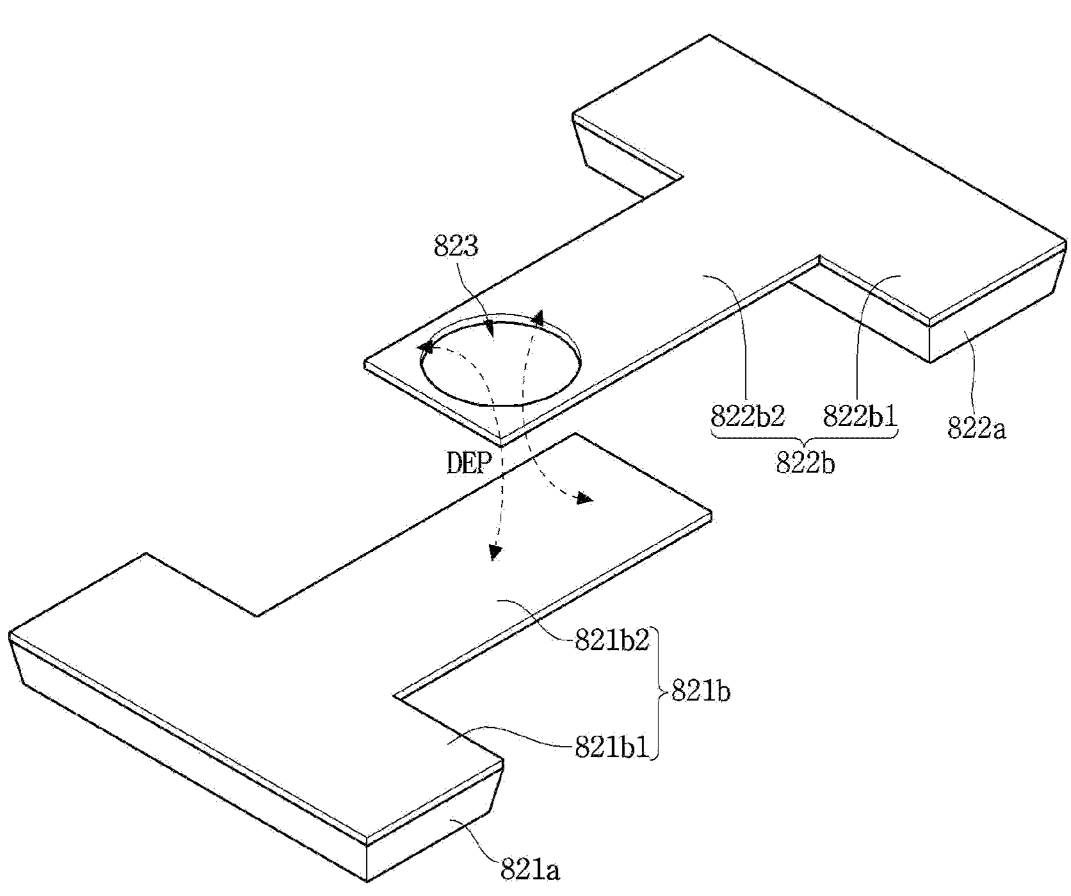

DISPLAY DEVICE COMPRISING SEMICONDUCTOR LIGHT-EMITTING DIODE

CROSS REFERENCE TO RELATED APPLICATIONS

This application is the National Phase of PCT International Application No. PCT/KR2022/004644, filed on Mar. 31, 2022, which claims priority under 35 U.S.C. 119(a) to Patent Application No. 10-2021-0042251, filed in the Republic of Korea on Mar. 31, 2021, all of which are hereby expressly incorporated by reference into the present application.

TECHNICAL FIELD

The embodiment relates to a display device, and more specifically, to a display device including a semiconductor light emitting device.

BACKGROUND ART

Display devices used in computer monitors, TVs, mobile phones, etc. include Organic Light Emitting Displays that emit light on their own, Liquid Crystal Displays (LCDs) that require a separate light source or and micro-LED displays.

A micro-LED display is a display that uses micro-LED, a semiconductor light emitting device with a diameter or cross-sectional area of 100 μm or less, as a display device.

Because micro-LED displays use micro-LED, a semiconductor light-emitting device, as a display device, micro-LED displays have excellent performance in many characteristics such as contrast ratio, response speed, color gamut, viewing angle, brightness, resolution, lifespan, luminous efficiency, and luminance.

In particular, the micro-LED display has the advantage of being able to freely adjust the size and resolution and implement a flexible display because the screen can be separated and combined in a modular manner.

However, because large micro-LED displays require more than millions of micro-LEDs, there is a technical problem that makes it difficult to quickly and accurately transfer micro-LEDs to the display panel.

Meanwhile, methods for transferring a semiconductor light emitting device to a substrate include a pick and place process, a laser lift-off method, or a self-assembly method.

Among these, the self-assembly method is a method in which the semiconductor light-emitting device finds its assembly position within the fluid on its own, and is an advantageous method for implementing a large-screen display device.

Meanwhile, when a light emitting device is transferred in a fluid, there is a problem that the assembly wiring is corroded by the fluid. Corrosion of the assembly wiring can cause an electrical short circuit and cause assembly defects.

In addition, when self-assembling a light-emitting device, there is a problem that the assembly force for the light-emitting device is weakened due to steps and gaps between the assembly wiring, and the thickness of the assembly wiring can cause a problem that the substrate becomes thicker.

Meanwhile, a self-assembly transfer process using dielectrophoresis (DEP) is being attempted in an internal, undisclosed technology, but there is a problem with a low self-assembly rate due to the non-uniformity of the DEP force.

DISCLOSURE

Technical Problem

The technical object of the embodiment is to provide a display device that improves the assembly rate of light-emitting devices by implementing assembly wiring in various forms.

Additionally, the technical object of the embodiment is to provide a display device that can prevent corrosion of assembly wiring.

In addition, the technical object of the embodiment is to provide a display device in which light-emitting devices can be easily bonded by reducing the step between assembly wirings.

Additionally, the technical object of the embodiment is to provide a display device that can precisely control the spacing between assembly wirings.

Additionally, the technical object of the embodiment is to provide a display device in which a light emitting device can be electrically connected to only one of a pair of assembly wirings.

Additionally, the technical object of the embodiment is to provide a display device with enhanced assembly force for light-emitting devices.

Additionally, the technical object of the embodiment is to provide a display device that eliminates parasitic capacitance.

In addition, the technical object of the embodiment is to provide a display device with a reduced panel thickness.

The technical object of the embodiment is not limited to the objects mentioned above and include what can be understood from the specification.

Technical Solution

A display device including a semiconductor light-emitting device according to an embodiment can include a substrate, first and second assembly wirings arranged alternately on the substrate and spaced apart from each other, a planarization layer disposed on the first assembly wiring and the second assembly wiring and having a first opening, and a semiconductor light emitting device having a first electrode, disposed inside the first opening, and overlapping the first assembly wiring and the second assembly wiring.

The first electrode of the semiconductor light emitting device can be electrically connected to one of the first assembly wiring and the second assembly wiring.

The embodiment can further include an insulating layer between the first assembly wiring and the first electrode of the semiconductor light emitting device.

The second assembly wiring can be exposed from the insulating layer through the first opening.

The first assembly wiring can include a first conductive layer disposed on the substrate and a first clad layer in contact with the first conductive layer.

The second assembly wiring can include a second conductive layer disposed on the insulating layer and a second clad layer in contact with the second conductive layer.

The first electrode of the semiconductor light emitting device can be in contact with the second clad layer.

A portion of the first conductive layer, a portion of the first clad layer, a portion of the second conductive layer, and a portion of the second clad layer can overlap the first opening.

The second clad layer can be disposed on the insulating layer.

The first conductive layer and the second conductive layer can overlap the planarization layer.

A portion of each of the first clad layer and the second clad layer can be disposed inside the first opening.

The first clad layer can be disposed under the insulating layer, and the second clad layer can be disposed on the insulating layer.

The first clad layer and the second clad layer can be disposed on the same plane under the insulating layer.

The second clad layer can be electrically connected to the second conductive layer on the insulating layer through a contact hole in the insulating layer.

The first assembly wiring and the second assembly wiring can be arranged on the same plane.

A portion of the first assembly wiring and a portion of the second assembly wiring can overlap the first opening. The sum of the width of a portion of the first assembly wiring in the first opening and the width between the first assembly wiring and the second assembly wiring in the first opening can be smaller than the height of the light emitting device.

The embodiment can further include a protrusion that protrudes from a sidewall of the planarization layer in the first opening and covers a portion of the first assembly wiring and a portion of the second assembly wiring.

The embodiment can further include a ground pad electrically connected to the active area of the substrate.

The first assembly wiring can vertically overlap the second assembly wiring, and the second assembly wiring can include an electrode hole in an area that vertically overlaps the first assembly wiring.

The first assembly wiring can include a first conductive layer and a first clad layer on the first conductive layer, and the second assembly wiring can include a second conductive layer and a second clad layer on the second conductive layer.

The first clad layer can include a first-first clad layer and a first-second clad layer extending from the first-first clad layer.

The second clad layer can include a second-first clad layer and a second-second clad layer extending from the second-first clad layer.

It can include a semiconductor light emitting device in which the first-second clad layer and the second-second clad layer overlap vertically.

The second-second clad layer can include the electrode hole.

In addition, a display device including a semiconductor light-emitting device according to an embodiment can include a substrate on which a plurality of sub-pixels are defined, a first assembly wiring arranged along the plurality of sub-pixels arranged on the same line among the plurality of sub-pixels, a second assembly line disposed along a plurality of sub-pixels arranged on the same line among the plurality of sub-pixels and disposed adjacent to each of the first assembly wirings, a planarization layer including a first opening overlapping the first assembly wiring and the second assembly wiring, and a light emitting device disposed in the first opening in each of the plurality of sub-pixels and electrically connected to the second assembly wiring.

The light emitting device can be bonded to the second assembly wiring at the first opening.

Each of the first assembly wiring can include a first conductive layer and a first clad layer electrically connected to the first conductive layer.

Each of the second assembly wiring can include a second conductive layer and a second clad layer electrically connected to the second conductive layer.

The first conductive layer and the first clad layer can be made of different materials, and the second conductive layer and the second clad layer can be made of different materials.

The embodiment further includes an insulating layer covering the first conductive layer and the first clad layer.

The second conductive layer is disposed on the insulating layer, and the planarization layer can cover the first conductive layer and the second conductive layer.

The first clad layer can extend from the first conductive layer to the inside of the first opening.

The second clad layer extends from the second conductive layer to the inside of the first opening and can contact the plurality of light emitting devices.

The embodiment can further include a ground pad electrically connected to the active area of the substrate.

The first assembly wiring can vertically overlap the second assembly wiring, and the second assembly wiring can include an electrode hole in an area that vertically overlaps the first assembly wiring.

Advantageous Effects

According to the embodiment, there is a technical effect in that the self-assembly wiring of the light emitting device can be used as a wiring for driving the light emitting device.

In addition, the embodiment has the technical effect of minimizing defects during self-assembly or bonding of light-emitting devices by forming various structures of a plurality of assembly wirings.

Additionally, the embodiment has the technical effect of minimizing corrosion and short circuit defects in a plurality of assembly wiring. For example, the embodiment can prevent corrosion of the conductive layer by using a clad layer that is resistant to corrosion.

Additionally, the embodiment has the technical effect of being able to precisely control the spacing between a plurality of assembly wirings.

Additionally, the embodiment has the technical effect of stably bonding a plurality of light-emitting devices by reducing the step between the plurality of assembly wirings. In addition, the embodiment has the technical effect of forming a protrusion in the planarization layer to overcome the step between the plurality of assembly wirings and stably bonding the light emitting device.

In addition, the embodiment has the technical effect of simplifying the insulating layer covering the first assembly wiring and easily separating the first assembly wiring and the light emitting device.

Additionally, the embodiment has the technical effect of strengthening the assembly force for the light emitting device by arranging a plurality of assembly wirings in a vertically symmetrical structure.

Additionally, the embodiment has the technical effect of eliminating parasitic capacitance through a grounding pad.

Additionally, the embodiment has the technical effect of reducing the thickness of the panel substrate. For example, in the embodiment, the thickness of the panel substrate can be reduced by extending the clad layer in the horizontal direction of the conductive layer and overlapping the clad layer over the opening where the light emitting device is assembled.

The effects according to the embodiment are not limited by the contents exemplified above, and more diverse effects are included in the embodiment.

DESCRIPTION OF DRAWINGS

FIG. 1 is a schematic plan view of a display device according to an embodiment.

FIG. 2 is a schematic enlarged plan view of a display device according to an embodiment.

FIG. 3 is a cross-sectional view taken along line III-III' of FIG. 2.

FIGS. 4A to 4G are process diagrams for explaining a manufacturing method of a display device according to an embodiment.

FIG. 5 is a cross-sectional view of a display device according to a second embodiment.

FIG. 6 is a cross-sectional view of a display device according to a third embodiment.

FIGS. 7A and 7B are cross-sectional views of a display device according to the fourth embodiment.

FIG. 8A is a cross-sectional view of a display device according to the fifth embodiment.

FIG. 8B is a cross-sectional view of a display device according to the sixth embodiment.

FIG. 9A is a cross-sectional view of a display device according to the seventh embodiment.

FIG. 9B is a cross-sectional view showing the DEP force in the seventh embodiment of FIG. 9A.

FIG. 10 is a perspective view showing the first and second assembly wiring in the seventh embodiment of FIG. 9A.

MODE FOR INVENTION

Hereinafter, embodiments disclosed in this specification will be described in detail with reference to the attached drawings. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, area or substrate is referred to as being 'on' another component, this includes either directly on the other element or there can be other intermediate elements in between.

Display devices described in this specification include digital TVs, mobile phones, smart phones, laptop computers, digital broadcasting terminals, personal digital assistants (PDAs), portable multimedia players (PMPs), navigation, and slates PCs, tablet PCs, ultra-books, desktop computers, etc. However, the features according to the embodiment described in this specification can be applied to a device capable of displaying even if it is a new product type that is developed in the future.

Hereinafter, embodiments will be described with reference to the drawings.

FIG. 1 is a schematic plan view of a display device according to an embodiment. For convenience of explanation, only the substrate 110 and the plurality of sub-pixels (SP) among the various components of the display device 100 are shown in FIG. 1.

The display device 100 according to an embodiment can include a flexible display manufactured on a thin and flexible substrate. Flexible displays can bend or curl like paper while maintaining the characteristics of existing flat displays.

In a flexible display, visual information can be implemented by independently controlling the light emission of unit pixels arranged in a matrix form. A unit pixel refers to the minimum unit for implementing one color. A unit pixel of a flexible display can be implemented by a light emitting device. In the embodiment, the light emitting device can be Micro-LED or Nano-LED, but is not limited thereto.

The substrate 110 is configured to support various components included in the display device 100 and can be made of an insulating material. For example, the substrate 110 can be made of glass or resin. Additionally, the substrate 110 can include polymer or plastic, or can be made of a material with flexibility.

The substrate 110 includes a display area (AA) and a non-display area (NA).

The display area AA is an area where a plurality of sub-pixels SP are arranged and an image is displayed. Each of the plurality of sub-pixels (SP) is an individual unit that emits light, and a semiconductor light-emitting device (LED) and a driving circuit are formed in each of the plurality of sub-pixels (SP). For example, the plurality of sub-pixels SP can include, but are not limited to, a red sub-pixel, a green sub-pixel, a blue sub-pixel, and/or a white sub-pixel. Hereinafter, the description will be made on the assumption that the plurality of sub-pixels SP includes a red sub-pixel, a green sub-pixel, and a blue sub-pixel, but is not limited thereto.

The non-display area (NA) is an area where images are not displayed, and is an area where various wiring, driver ICs, etc. for driving the sub-pixels (SP) arranged in the display area (AA) are placed. For example, various ICs such as gate driver ICs and data driver ICs and driving circuits can be placed in the non-display area (NA). Meanwhile, the non-display area NA can be located on the back of the substrate 110, that is, on the side without the sub-pixel SP, or can be omitted, and is not limited to what is shown in the drawing.

The display device 100 of the embodiment can drive the light emitting device including an active matrix (AM) method or a passive matrix (PM) method.

Hereinafter, FIGS. 2 and 3 will be referred to together for a more detailed description of the plurality of sub-pixels (SP).

FIG. 2 is a schematic enlarged plan view of a display device according to an embodiment. FIG. 3 is a cross-sectional view taken along line III-III' of FIG. 2.

Referring to FIGS. 2 and 3, a display device 100 according to an embodiment can include Multiple scan wirings (SL), multiple data wirings (DL), multiple high potential power supply wirings (VDD), a plurality of assembly wirings 120, a plurality of reference wirings (RL) and a black matrix (BM), and a plurality of sub-pixels (SP), each of the first transistor (TR1), second transistor (TR2), third transistor (TR3), storage capacitor (ST), semiconductor light emitting device (LED), light blocking layer (LS), buffer layer 111, gate insulating layer 112, a plurality of passivation layers (113, 115, 116), a plurality of planarization layers (114, 117, 118), a connection electrode (CE), a pixel electrode.

Referring to FIGS. 2 and 3, a plurality of data wirings DL, a first layer (VDD1) and a second layer (VDD2) of the high-potential power wiring (VDD), a plurality of reference wirings (RL), and a plurality of assembly wiring 120 can extend in the column direction between the plurality of sub-pixels SP. The third layer VDD3 of the plurality of scan lines SL and the high potential power line VDD can extend in the row direction between the plurality of sub-pixels SP. Additionally, a first transistor TR1, a second transistor TR2, a third transistor TR3, and a storage capacitor ST can be disposed in each of the plurality of sub-pixels SP.

First, the first layer (VDD1) and the light blocking layer (LS) of the high-potential power line (VDD) can be disposed on the substrate 110.

The high-potential power supply line (VDD) is a line that transmits a high-potential power supply voltage to each of the plurality of sub-pixels (SP). A plurality of high-potential power supply lines (VDD) can transmit a high-potential power supply voltage to the second transistor TR2 of each of the plurality of sub-pixels (SP).

Meanwhile, the plurality of high-potential power supply wirings (VDD) can be made of a single layer or multiple layers. For convenience of explanation, hereinafter, the description will be made on the assumption that the plurality of high-potential power supply wirings (VDD) are made of a plurality of layers.

The high-potential power wiring (VDD) includes a plurality of first layers (VDD1), a plurality of second layers (VDD2), and a plurality of third layers (VDD3) connecting them. The first layer VDD1 can extend in the column direction between each of the plurality of sub-pixels SP.

A light blocking layer LS can be disposed in each of the plurality of sub-pixels SP on the substrate 110. The light blocking layer LS blocks light incident from the lower part of the substrate 110 to the second active layer ACT2 of the second transistor TR2, which will be described later, and can minimize leakage current.

The buffer layer 111 can be disposed on the first layer (VDD1) and the light blocking layer (LS) of the high-potential power line (VDD). The buffer layer 111 can reduce penetration of moisture or impurities through the substrate 110. The buffer layer 111 can include, for example, a single layer or a multiple layer of silicon oxide (SiOx) or silicon nitride (SiNx), but is not limited thereto. However, the buffer layer 111 can be omitted depending on the type of substrate 110 or the type of transistor, but is not limited thereto.

A plurality of scan wirings (SL), a plurality of reference wirings (RL), a plurality of data wirings (DL), a first transistor (TR1), the second transistor TR2, third transistor TR3, and storage capacitor ST can be disposed on the buffer layer 111.

First, the first transistor TR1 can be disposed in each of the plurality of sub-pixels SP. The first transistor TR1 includes a first active layer ACT1, a first gate electrode GE1, a first source electrode SE1, and a first drain electrode DE1. The first active layer (ACT1) can be disposed on the buffer layer (111). The first active layer (ACT1) can be made of a semiconductor material such as oxide semiconductor, amorphous silicon, or polysilicon, but is not limited thereto.

The gate insulating layer 112 can be disposed on the first active layer ACT1. The gate insulating layer 112 is an insulating layer for insulating the first active layer (ACT1) and the first gate electrode (GE1), and can include a single layer or multiple layers of silicon oxide (SiOx) or silicon nitride (SiNx), but is not limited thereto.

The first gate electrode GET can be disposed on the gate insulating layer 112. The first gate electrode GET can be electrically connected to the scan line SL. The first gate electrode GET is made of a conductive material, such as copper (Cu), aluminum (Al), molybdenum (Mo), nickel (Ni), titanium (Ti), chromium (Cr), or an alloy thereof, but is not limited to this.

The first passivation layer 113 can be disposed on the first gate electrode GET. Contact holes can be formed in the first passivation layer 113 to connect the first source electrode SE1 and the first drain electrode DE1 to the first active layer ACT1. The first passivation layer 113 is an insulating layer to protect the structure below the first passivation layer 113, and can include a single layer or multiple layers of silicon oxide (SiOx) or silicon nitride (SiNx), but is not limited thereto.

A first source electrode (SET) and a first drain electrode (DE1) electrically connected to the first active layer (ACT1) can be disposed on the first passivation layer (113). The first drain electrode DE1 can be connected to the data line DL, and the first source electrode SE1 can be connected to the second gate electrode GE2 of the second transistor TR2. The first source electrode (SET) and the first drain electrode (DE1) are made of a conductive material, such as copper (Cu), aluminum (Al), molybdenum (Mo), nickel (Ni), titanium (Ti), chromium (Cr) or an alloy thereof, but is not limited thereto.

Meanwhile, in the embodiment, each of the first source electrode (SET) and the first drain electrode (DE1) is described as being connected to the second gate electrode (GE2) and the data line (DL), but depending on the type of transistor, the first source electrode SE1 can be connected to the data line DL, and the first drain electrode DE1 can be connected to the second gate electrode GE2 of the second transistor TR2, but are not limited thereto.

The first gate electrode GET of the first transistor TR1 is connected to the scan line SL and can be turned on or off depending on the scan signal. The first transistor TR1 can transfer a data voltage to the second gate electrode GE2 of the second transistor TR2 based on the scan signal, and can be referred to as a switching transistor.

Meanwhile, a plurality of data lines DL and a plurality of reference lines RL can be disposed on the gate insulating layer 112 along with the first gate electrode GET. The plurality of data lines DL and the reference lines RL can be formed of the same material and process as the first gate electrode GET.

The plurality of data lines DL are lines that transmit data voltages to each of the plurality of sub-pixels SP. The plurality of data lines DL can transmit data voltage to the first transistor TR1 of each of the plurality of sub-pixels SP. For example, the plurality of data lines (DL) include a data line (DL) that transmits the data voltage to the red sub-pixel (SPR), a data line (DL) that transmits the data voltage to the green sub-pixel (SPG), and a blue sub-pixel (DL) that transmits the data voltage to the red sub-pixel (SPR). It can include a data line (DL) that transmits a data voltage to the pixel (SPB).

The plurality of reference wirings RL are wirings that transmit a reference voltage to each of the plurality of sub-pixels SP. The plurality of reference lines RL can transmit a reference voltage to the third transistor TR3 of each of the plurality of sub-pixels SP.

A second transistor TR2 can be disposed in each of the plurality of sub-pixels SP. The second transistor TR2 can include a second active layer ACT2, a second gate electrode GE2, a second source electrode SE2, and a second drain electrode DE2. The second active layer (ACT2) can be disposed on the buffer layer 111. The second active layer ACT2 can be made of a semiconductor material such as oxide semiconductor, amorphous silicon, or polysilicon, but is not limited thereto.

The gate insulating layer 112 can be disposed on the second active layer ACT2, and the second gate electrode GE2 can be disposed on the gate insulating layer 112. The second gate electrode GE2 can be electrically connected to the first source electrode SE1 of the first transistor TR1. The second gate electrode GE2 is made of a conductive material, such as copper (Cu), aluminum (Al), molybdenum (Mo), nickel (Ni), titanium (Ti), chromium (Cr), or an alloy thereof, but is not limited to this.

The first passivation layer 113 can be disposed on the second gate electrode GE2, and the second source electrode SE2 and the second drain electrode DE2 can be disposed on the first passivation layer 113. The second source electrode SE2 can be electrically connected to the second active layer ACT2. The second drain electrode DE2 can be electrically connected to the second active layer ACT2 and at the same time can be electrically connected to the high potential power supply line VDD. The second drain electrode DE2 can be disposed between the first layer VDD1 and the second layer VDD2 of the high potential power line VDD and electrically connected to the high potential power line VDD.

The second transistor TR2 has a second gate electrode GE2 connected to the first source electrode SE1 of the first transistor TR1, and is turned on by the data voltage transmitted when the first transistor TR1 is turned on. And the turned-on second transistor TR2 can transfer a driving current to the light emitting device (LED) based on the high-potential power supply voltage from the high-potential power supply line (VDD), and thus can be referred to as a driving transistor.

A third transistor TR3 is disposed in each of the plurality of sub-pixels SP. The third transistor TR3 includes a third active layer ACT3, a third gate electrode GE3, a third source electrode SE3, and a third drain electrode DE3. The third active layer (ACT3) can be disposed on the buffer layer 111. The third active layer (ACT3) can be made of a semiconductor material such as oxide semiconductor, amorphous silicon, or polysilicon, but is not limited thereto.

The gate insulating layer 112 can be disposed on the third active layer ACT3, and the third gate electrode GE3 can be disposed on the gate insulating layer 112. The third gate electrode GE3 is connected to the scan line SL, and the third transistor TR3 can be turned on or off by the scan signal. The third gate electrode GE3 is made of a conductive material, such as copper (Cu), aluminum (Al), molybdenum (Mo), nickel (Ni), titanium (Ti), chromium (Cr), or an alloy thereof, but is not limited to this.

However, although it is explained that the third gate electrode (GE3) and the first gate electrode (GE1) are connected to the same scan line (SL), the third gate electrode (GE3) is a different scan line from the first gate electrode (GE1). It can be connected to (SL), but is not limited to this.

The first passivation layer 113 can be disposed on the third gate electrode GE3, and the third source electrode SE3 and the third drain electrode DE3 can be disposed on the first passivation layer 113. The third source electrode (SE3) is formed integrally with the second source electrode (SE2), is electrically connected to the third active layer (ACT3), and is electrically connected to the second source electrode (SE2) of the second transistor (TR2). And the third drain electrode DE3 can be electrically connected to the reference wiring RL.

The third transistor TR3 can be electrically connected to the second source electrode (SE2), the reference line (RL), and the storage capacitor (ST) of the second transistor (TR2), which is a driving transistor. It can be referred to as a sensing transistor.

A storage capacitor (ST) can be disposed in each of the plurality of sub-pixels (SP). The storage capacitor ST includes a first capacitor electrode ST1 and a second capacitor electrode ST2. The storage capacitor ST is connected between the second gate electrode GE2 and the second source electrode SE2 of the second transistor TR2, and stores the voltage while the light emitting device LED emits light. The voltage level of the gate electrode of TR2) can be maintained constant.

The first capacitor electrode ST1 can be integrated with the second gate electrode GE2 of the second transistor TR2. Accordingly, the first capacitor electrode ST1 can be electrically connected to the second gate electrode GE2 of the second transistor TR2 and the first source electrode SE1 of the first transistor TR1.

The second capacitor electrode can be disposed on the first capacitor electrode ST1 with the first passivation layer 113 interposed therebetween. The second capacitor electrode ST2 can be integrated with the second source electrode SE2 of the second transistor TR2 and the third source electrode SE3 of the third transistor TR3. Accordingly, the second capacitor electrode ST2 can be electrically connected to the second transistor TR2 and the third transistor TR3.

Meanwhile, the first source electrode (SE1), the first drain electrode (DE1), the second source electrode (SE2), the second drain electrode (DE2), the third source electrode (SE3), the third drain electrode (DE3) and a plurality of scan lines SL are disposed on the first passivation layer 113 along with the second capacitor electrode ST2.

The plurality of scan wirings (SL) are wirings that transmit scan signals to each of the plurality of sub-pixels (SP). The plurality of scan lines SL can transmit scan signals to the first transistor TR1 of each of the plurality of sub-pixels SP. For example, each of the plurality of scan lines SL extends in the row direction and can transmit a scan signal to a plurality of sub-pixels SP arranged in the same row.

Next, the first planarization layer 114 includes a plurality of scan lines (SL), a plurality of reference lines (RL), a plurality of data lines (DL), a first transistor (TR1), a second transistor (TR2), and a plurality of data lines (DL). 3 can be placed on the transistor (TR3) and the storage capacitor (ST). The first planarization layer 114 can planarize the upper part of the substrate 110 on which the plurality of transistors are disposed. The first planarization layer 114 can include a single layer or a double layer, and can be made of, for example, an acryl-based organic material, but is not limited thereto.

A second passivation layer 115 can be disposed on the first planarization layer 114. The second passivation layer 115 is an insulating layer to protect the structure below the second passivation layer 115 and improve the adhesion of the structure formed on the second passivation layer 115, and is made of silicon oxide (SiOx) or it can include a single layer or multiple layers of silicon nitride (SiNx), but is not limited thereto.

On the second passivation layer 115, a second layer (VDD2) of the high potential power supply wiring (VDD), a plurality of first assembly wirings 121 among the plurality of assembly wirings 120, and a connection electrode (CE) will be disposed.

First, the plurality of assembly wirings 120 generate an electric field to align the plurality of light-emitting devices (LEDs) when manufacturing the display device 100, and the plurality of light-emitting devices (LEDs) are aligned when the display device 100 is driven. It can be wiring that supplies a low-potential power supply voltage. Accordingly, the assembly wiring 120 can be referred to as a low-potential power wiring.

The plurality of assembly wirings 120 are arranged in a column direction along the plurality of sub-pixels SP arranged on the same line. The plurality of assembly wirings 120 can be arranged to overlap the plurality of sub-pixels SP arranged in the same column. For example, one first assembly wiring 121 and a second assembly wiring 122 are disposed in the red sub-pixel (SPR) arranged in the same column, and one first assembly wiring (122) is disposed in the green sub-pixel (SPG). 121) and a second assembly wiring 122 are disposed, and one first assembly wiring 121 and a second assembly wiring 122 can be disposed in the blue sub-pixel SPB.

The plurality of assembly wirings 120 includes a plurality of first assembly wirings 121 and a plurality of second assembly wirings 122. When the display device 100 is driven, a low-potential voltage can be applied in alternating current to the plurality of first assembly wirings 121 and the plurality of second assembly wirings 122. The plurality of first assembly wirings 121 and the plurality of second assembly wirings 122 can be alternately arranged. Additionally, in each of the plurality of sub-pixels SP, one first assembly wiring 121 and one second assembly wiring 122 can be disposed adjacent to each other.

The plurality of first assembly wirings 121 and the plurality of second assembly wirings 122 can be made of a conductive material, for example, copper (Cu) and chromium (Cr), but are not limited thereto.

The plurality of first assembly wirings 121 can include a first conductive layer 121*a* and a first clad layer 121*b*. The first conductive layer 121*a* can be disposed on the second passivation layer 115. The first clad layer 121*b* can be in contact with the first conductive layer 121*a*. For example, the first clad layer 121*b* can be disposed to cover the top and side surfaces of the first conductive layer 121*a*. And the first conductive layer 121*a* can have a thickness greater than that of the first clad layer 121*b*.

The first clad layer 121*b* is made of a material that is more resistant to corrosion than the first conductive layer 121*a*, and when manufacturing the display device 100, the first conductive layer 121*a* of the first assembly wiring 121 and the second assembly wiring (Short circuit defects due to migration between the second conductive layers 122*a* of 122) can be minimized. For example, the first clad layer 121*b* can be made of molybdenum (Mo), molybdenum titanium (MoTi), etc., but is not limited thereto.

A second layer (VDD2) of the high potential power supply line (VDD) is disposed on the second passivation layer (115). The second layer (VDD2) extends in the column direction between each of the plurality of sub-pixels (SP) and can overlap the first layer (VDD1). The first layer (VDD1) and the second layer (VDD2) can be electrically connected through a contact hole formed in the insulating layers formed between the first layer (VDD1) and the second layer (VDD2). The second layer VDD2 can be formed of the same material and process as the first assembly wiring 121, but is not limited thereto.

A connection electrode (CE) can be disposed in each of the plurality of sub-pixels (SP). The connection electrode CE is electrically connected to the second capacitor electrode ST2 and the second source electrode SE2 of the second transistor TR2 through a contact hole formed in the second passivation layer 115. The connection electrode (CE) is an electrode for electrically connecting the light emitting device (LED) and the second transistor (TR2), which is a driving transistor, and includes a first connection layer (CE1) and a second connection layer (CE2). For example, the first connection layer CE1 can be formed of the same material on the same layer as the first conductive layer 121*a* of the first assembly wiring 121, and the second connection layer CE2 can be formed of the same material as the first conductive layer 121*a* of the first assembly wiring 121 and can be formed of the same material as the layer 121*b*.

Subsequently, a third passivation layer 116 can be disposed on the second layer VDD2, the first assembly wiring 121, and the connection electrode CE. The third passivation layer 116 is an insulating layer to protect the structure below the third passivation layer 116, and can include a single layer or multiple layers of silicon oxide (SiOx) or silicon nitride (SiNx), but is not limited thereto. In addition, the third passivation layer 116 can function as an insulating layer to prevent short circuit defects due to migration between the first assembly wiring 121 and the second assembly wiring 122 when manufacturing the display device 100. This will be described later with reference to FIGS. 4A to 4G.

Among the plurality of assembly wirings 120, a plurality of second assembly wirings 122 can be disposed on the third passivation layer 116. Each of the plurality of second assembly wirings 122 is disposed in a plurality of sub-pixels (SP) arranged on the same line as described above, and the plurality of first assembly wirings 121 and the plurality of second assembly wirings 122 can be placed spaced apart from each other.

Each of the plurality of second assembly wirings 122 includes a second conductive layer 122*a* and a second clad layer 122*b*. The second conductive layer 122*a* is disposed on the third passivation layer 116. And the second clad layer 122*b* can be electrically connected to the second conductive layer 122*a*. For example, the second clad layer 122*b* can be disposed to cover the top and side surfaces of the second conductive layer 122*a*. And the second conductive layer 122*a* can have a thickness greater than that of the second clad layer 122*b*.

The second clad layer 122*b* is made of a material that is more resistant to corrosion than the second conductive layer 122*a*, so that short circuit defects occurring due to migration between the first assembly wiring 121 and the second assembly wiring 122 when manufacturing the display device 100 can be minimized. For example, the second clad layer 122*b* can be made of molybdenum (Mo), molybdenum titanium (MoTi), etc., but is not limited thereto.

Next, the second planarization layer 117 can be disposed on the plurality of second assembly wirings 122. The second planarization layer 117 can include a single layer or a double layer, and can be made of, for example, an acryl-based organic material, but is not limited thereto.

Meanwhile, the second planarization layer 117 includes a plurality of first openings 117*a* on which each of the plurality of light emitting devices (LEDs) is seated, and a plurality of second openings 117*b* exposing each of the plurality of connection electrodes (CE).

A plurality of first openings 117*a* can be disposed in each of the plurality of sub-pixels SP. At this time, more than one first opening 117*a* can be disposed in one sub-pixel SP. For example, one first opening 117*a* or two first openings 117*a* can be disposed in one sub-pixel SP.

The plurality of first openings 117*a* are parts into which a plurality of light emitting devices (LEDs) are inserted, and can in addition be referred to as pockets. The plurality of first openings 117*a* can be formed to overlap the plurality of assembly wirings 120. For example, one first opening 117*a* can overlap the first assembly wiring 121 and the second assembly wiring 122 disposed adjacent to each other in one sub-pixel SP.

Additionally, a portion of the second clad layer 122*b* of the plurality of second assembly wirings 122 can be exposed through the first opening 117*a*. On the other hand, because the third passivation layer 116 covers all of the first assembly wiring 121 in the first opening 117*a*, the first assembly wiring 121 overlaps the first opening 117*a*, but may not be exposed from the first opening 117*a*.

A plurality of second openings 117*b* can be disposed in the plurality of sub-pixels SP. The plurality of second openings 117*b* can be portions that expose the connection electrodes CE of each of the plurality of sub-pixels SP. The connection electrode (CE) under the second planarization layer 117 is exposed through the plurality of second openings 117*b*, can be electrically connected to the light emitting device (LED), and can receive a driving current from the second transistor (TR2) and the driving current can be delivered through a light emitting device (LED). At this time, the third passivation layer 116 can have a contact hole in the area overlapping the second opening 117*b*, and the connection electrode CE is formed from the second planarization layer 117 and the third passivation layer 116 can be exposed.

A plurality of light emitting devices (LEDs) is disposed in the plurality of first openings 117*a*. The plurality of light emitting devices (LEDs) are light emitting devices (LEDs) that emit light by electric current. The plurality of light emitting devices (LEDs) can include light emitting devices (LEDs) that emit red light, green light, blue light, etc., and a combination of these can produce light of various colors, including white. For example, the light emitting device (LED) can be a light emitting diode (LED) or a micro-LED, but is not limited thereto.

Hereinafter, a plurality of light-emitting devices (LEDs) are arranged in the red sub-pixel (SPR), the red light-emitting device 130, the green light-emitting device 140 located in the green sub-pixel (SPG), and the blue sub-pixel (SPB). The description will be made assuming that the blue light emitting device 150 is included. However, the plurality of light emitting devices (LEDs) include light emitting devices (LEDs) that emit light of the same color, and a separate light conversion member is used to convert the light from the plurality of light emitting devices (LEDs) into light of different colors. Thus, images in various colors can be displayed, but are not limited to this.

The plurality of light-emitting devices (LEDs) 150 include a red light-emitting device 130 disposed in the red sub-pixel (SPR), a green light-emitting device 140 disposed in the green sub-pixel (SPG), and a blue light-emitting device 140 disposed in the blue sub-pixel (SPB). Each of the red light-emitting device 130, the green light-emitting device 140, and the blue light-emitting device 150 can include a first semiconductor layer, a second semiconductor layer, a first electrode, and a second electrode in common. And the red light-emitting device 130 includes a light-emitting layer that emits red light, the green light-emitting device 140 includes a light-emitting layer that emits green light, and the blue light-emitting device 150 includes a light-emitting layer that emits blue light.

Referring to FIG. 3, the red light-emitting device 130 disposed in the red sub-pixel (SPR) can have a second semiconductor layer 133 disposed on the first semiconductor layer 131. The first semiconductor layer 131 and the second semiconductor layer 133 can be layers formed by doping n-type and p-type impurities into a specific material. For example, the first semiconductor layer 131 and the second semiconductor layer 133 can include an AlInGaP-based semiconductor layer, for example, indium aluminum phosphide (InAlP), gallium arsenide (GaAs), etc. and can be a layer doped with type or n-type impurities. The p-type impurities can be magnesium (Mg), zinc (Zn), beryllium (Be), etc., and the n-type impurities can be silicon (Si), germanium (Ge), tin (Sn), etc., but are not limited thereto. A light emitting layer 132 that emits red light is disposed between the first semiconductor layer 131 and the second semiconductor layer 133. The light emitting layer 132 can emit light by receiving holes and electrons from the first semiconductor layer 131 and the second semiconductor layer 133. The light-emitting layer 132 can have a single-layer or multi-quantum well (MQW) structure.

The light emitting layer 132 can convert injected electrical energy into light with a specific wavelength within the range of about 570 nm to about 630 nm. The change in specific wavelength is determined by the size of the band gap of the light emitting diode. The band gap size can be adjusted by changing the composition ratio of Al and Ga. For example, as the composition ratio of Al increases, the wavelength becomes shorter.

The first electrode 134 can be disposed on the lower surface of the first semiconductor layer 131, and the second electrode 135 can be disposed on the upper surface of the second semiconductor layer 133. The first electrode 134 is an electrode bonded to the second assembly wiring 122 exposed through the first opening 117*a*, and the second electrode 135 is a pixel electrode (PE) and a second semiconductor layer 133 to be described later. The first electrode 134 and the second electrode 135 can be formed of a conductive material.

At this time, in order to bond the first electrode 134 to the second assembly wiring 122, the first electrode 134 can be made of a eutectic metal. For example, the first electrode 134 is made of tin (Sn), indium (In), zinc (Zn), lead (Pb), nickel (Ni), gold (Au), platinum (Pt), and copper (Cu), but is not limited to, etc.

And both the green light-emitting device 140 and the blue light-emitting device 150 can be formed with the same or similar structure as the red light-emitting device 130. For example, the green light-emitting device 140 includes a first electrode, a first semiconductor layer on the first electrode, a green light-emitting layer on the first semiconductor layer, a second semiconductor layer on the green light-emitting layer, and a second electrode on the second semiconductor layer. The blue light emitting device can in addition include a structure in which a first electrode, a first semiconductor layer, a blue light emitting layer, a second semiconductor layer, and a second electrode are sequentially stacked.

However, the green light-emitting device 140 and the blue light-emitting device 150 can be formed of a compound selected from the group including GaN, AlGaN, InGaN, AlInGaN, GaP, AlN, GaAs, AlGaAs, InP, and mixtures thereof, but it is not limited to this.

Meanwhile, although not shown in the drawing, an insulating layer surrounding a portion of each of the plurality of light emitting devices (LEDs) can be disposed. Specifically, the insulating layer can cover at least one side of the light emitting device (LED) among the outer surfaces of the plurality of light emitting devices (LED). An insulating layer is formed on the light emitting device (LED) to protect the light emitting device (LED), and when forming the first electrode 134 and the second electrode 135, the first semiconductor layer 131 and the second semiconductor layer 133, electrical short circuit can be prevented.

Next, the third planarization layer 118 can be disposed on the plurality of light emitting devices (LEDs). The third planarization layer 118 can planarize the upper part of the substrate 110 on which the plurality of light-emitting devices (LEDs) are disposed, and the plurality of light-emitting devices (LEDs) are formed through the third planarization layer 118 through the first opening 117*a*. The third planarization layer 118 can include a single layer or a double layer, and can be made of, for example, an acryl-based organic material, but is not limited thereto.

The pixel electrode PE is disposed on the third planarization layer 118. The pixel electrode (PE) can be an electrode for electrically connecting a plurality of light emitting devices (LED) and the connection electrode (CE). The pixel electrode (PE) can be electrically connected to the light emitting device (LED) of the first opening (117*a*) and the connection electrode (CE) of the second opening (117*b*) through a contact hole formed in the third planarization layer (118). Accordingly, the second electrode 135 of the light emitting device (LED), the connection electrode (CE), and the second transistor (TR2) can be electrically connected through the pixel electrode (PE).

The third layer (VDD3) of the high potential power line (VDD) can be disposed on the third planarization layer (118). The third layer (VDD3) can electrically connect the first layer (VDD1) and the second layer (VDD2) arranged in different rows. For example, the third layer (VDD3) extends in the row direction between the plurality of sub-pixels (SP), and connects the plurality of second layers (VDD2) of the high potential power supply line (VDD) extending in the column direction to each other electrically connected with. In addition, as the plurality of high-potential power supply lines (VDD) are connected in a mesh form through the third layer (VDD3), there is a technical effect of reducing the voltage drop phenomenon.

The black matrix BM can be disposed on the third planarization layer 118. The black matrix BM can be disposed between the plurality of sub-pixels SP on the third planarization layer 118. The black matrix (BM) can reduce color mixing between the plurality of sub-pixels (SP). The black matrix (BM) can be made of an opaque material, for example, black resin, but is not limited thereto.

A protective layer 119 can be disposed on the pixel electrode (PE), the third planarization layer 118, and the black matrix (BM). The protective layer 119 is a layer to protect the structure below the protective layer 119, and can include a single layer or multiple layers of translucent epoxy, silicon oxide (SiOx), or silicon nitride (SiNx), but is not limited thereto.

Meanwhile, in the first opening 117*a*, the plurality of first assembly wirings 121 are spaced apart from the plurality of light emitting devices (LED), and only the plurality of second assembly wirings 122 are in contact with the plurality of light emitting devices (LED). This is to prevent defects that occur when a plurality of light emitting devices (LEDs) come into contact with both the first assembly wiring 121 and the plurality of second assembly wiring 122 during the manufacturing process of the display device 100. A third passivation layer 116 can be formed on the first assembly wiring 121, and a plurality of light emitting devices (LEDs) can be contacted to the plurality of second assembly wirings 122.

Hereinafter, the manufacturing method of the display device 100 according to the embodiment will be described in detail with reference to FIGS. 4A to 4G.

FIGS. 4A to 4G are process diagrams for explaining a manufacturing method of a display device according to an embodiment.

FIGS. 4A to 4F are process diagrams for explaining a manufacturing method of a display device according to an embodiment. FIGS. 4A and 4B are process diagrams for explaining a process of self-assembling a plurality of light emitting devices (LEDs) into the first opening 117*a*. FIG. 4C is a schematic plan view of the mother substrate 10 used for self-assembly of a plurality of light emitting devices (LEDs). FIG. 4D is a diagram schematically showing the electrical connection relationship between the plurality of assembly wirings 120 and the assembly pad PD. FIG. 4E is a schematic plan view of a plurality of substrates 110 formed by scribing the mother substrate 10 after self-assembly of a plurality of light emitting devices (LEDs) is completed. FIG. 4F is a schematic cross-sectional view of area X in FIG. 4E.

Referring to FIG. 4A, a light emitting device (LED) is introduced into the chamber (CB) filled with the fluid (WT). The fluid WT can include water, etc., and the chamber CB filled with the fluid WT can have an open top.

Next, the mother substrate 10 can be placed on the chamber (CB) filled with light emitting devices (LED). The mother substrate 10 is a substrate include a plurality of substrates 110 forming the display device 100, and when self-assembling a plurality of light emitting devices (LEDs), a plurality of assembly wirings 120 and a second planarization layer 117 are can be used.

Then, the mother substrate 10 formed with the first assembly wiring 121, the second assembly wiring 122, and the second planarization layer 117 is placed on the chamber CB or inserted into the chamber CB. At this time, the mother substrate 10 can be positioned so that the first opening 117*a* of the second planarization layer 117 and the fluid WT face each other.

Next, the magnet MG can be placed on the mother substrate 10. Light emitting devices (LEDs) that sink or float on the bottom of the chamber (CB) can move toward the mother substrate 10 by the magnetic force of the magnet (MG).

At this time, the light emitting device (LED) can include a magnetic material to move by a magnetic field. For example, the first electrode 134 or the second electrode 135 of the light emitting device (LED) can include a ferromagnetic material such as iron, cobalt, or nickel.

Next, the light emitting device (LED) moved toward the second planarization layer 117 by the magnet (MG) can be self-assembled in the first opening 117*a* by the electric field formed by the first assembly wiring 121 and the second assembly wiring 122.

An alternating voltage can be applied to the plurality of first assembly wirings 121 and the plurality of second assembly wirings 122 to generate an electric field. Due to this electric field, the light emitting device (LED) is dielectrically polarized and can have polarity. And a dielectric polarized light emitting device (LED) can be moved or fixed in a specific direction by dielectrophoresis (DEP), that is, an electric field. Therefore, a plurality of light emitting devices (LEDs) can be fixed within the first opening 117*a* of the second planarization layer 117 using dielectrophoresis.

Next, the mother substrate 10 is rotated at 180 with the light-emitting device (LED) fixed within the first opening 117*a* using the electric fields of the plurality of first assembly wirings 121 and the plurality of second assembly wirings 122. In the embodiment, the mother substrate 10 can be turned over and a subsequent process can be performed while voltage is applied to the plurality of first assembly wirings 121 and the plurality of second assembly wirings 122.

And with the first electrode 134 of the light emitting device (LED) located on the second assembly wiring 122, heat and pressure are applied to the light emitting device (LED) to connect the light emitting device (LED) to the second assembly wiring 122. For example, the first electrode 134 of the light emitting device (LED) can be bonded to the second assembly wiring 122 through eutectic bonding. Eutectic bonding is a bonding method using heat compression at high temperatures and is one of the bonding processes that is very strong and highly reliable. The eutectic bonding method not only realizes high bonding strength, but in addition has the advantage of eliminating the need to apply a separate adhesive from the outside. However, the bonding method of the plurality of light emitting devices (LEDs) can be configured in various ways other than eutectic bonding, but is not limited thereto.

Meanwhile, different voltages are applied to the plurality of first assembly wirings 121 and the plurality of second assembly wirings 122 when manufacturing the display device 100, but the same voltage can be applied when driving the display device 100. To this end, when manufacturing the display device 100, the plurality of first assembly wirings 121 and the plurality of second assembly wirings 122 can be connected to different assembly pads PD and different voltages can be applied.

In this regard, referring to FIG. 4C, when manufacturing the display device 100, in the state of the mother substrate 10, the assembly wiring 120 on the plurality of substrates 110 is connected to the assembly pad (PD) outside the plurality of substrates 110. Specifically, a plurality of substrates 110 forming the display device 100, a plurality of assembly pads PD, and a plurality of assembly wiring connection parts PL are disposed on the mother substrate 10.

The plurality of assembly pads PD are pads for applying voltage to the plurality of assembly wirings 120, and are electrically connected to the plurality of assembly wirings 120 disposed on each of the plurality of substrates 110 forming the mother substrate 10. A plurality of assembly pads (PD) can be formed on the mother substrate 10 outside the substrate 110 of the display device 100, and when the manufacturing process of the display device 100 is completed, the substrate (PD) of the display device 100 110) and can be separated from. For example, when two substrates 110 are formed on the mother substrate 10, the plurality of first assembly wirings 121 disposed on each substrate 110 are connected to one assembly pad PD. And, the plurality of second assembly wirings 122 can be connected to other assembly pads PD.

Therefore, after placing the mother substrate 10 in the chamber CB into which a plurality of light emitting devices (LEDs) are inserted, an alternating voltage is applied to the plurality of assembly wirings 120 through the plurality of assembly pads PD to create an electric field and a plurality of light emitting devices (LEDs) can be easily self-assembled into the first opening 117*a* of the second planarization layer 117.

Meanwhile, when self-assembling a plurality of light emitting devices (LEDs) for each of a plurality of sub-pixels (SP), a plurality of assembly wirings 120 arranged in a plurality of red sub-pixels (SPR), a plurality of green sub-pixels (SPG) The plurality of assembly wirings 120 arranged in and the plurality of assembly wirings 120 arranged in the plurality of blue sub-pixels SPB can be connected to different assembly pads PD.

In this case, the plurality of assembly pads PD include the first assembly pad PD1, the second assembly pad PD2, the third assembly pad PD3, the fourth assembly pad PD4, and the fifth assembly pad PD5 and a sixth assembly pad PD6.

The first assembly pad PD1 is a pad for applying voltage to the plurality of first assembly wirings 121 disposed in the plurality of red sub-pixels (SPR) on the mother substrate 10. The fourth assembly pad PD4 is a pad for applying voltage to the plurality of second assembly wirings 122 disposed in the plurality of red sub-pixels SPR on the mother substrate 10.

The second assembly pad PD2 is a pad for applying voltage to the plurality of first assembly wirings 121 disposed in the plurality of green sub-pixels (SPG) on the mother substrate 10. The fifth assembly pad PD5 is a pad for applying voltage to the plurality of second assembly wirings 122 disposed in the plurality of green sub-pixels (SPG) on the mother substrate 10.

The third assembly pad PD3 is a pad for applying voltage to the plurality of first assembly wirings 121 disposed in the plurality of blue sub-pixels (SPB) on the mother substrate 10. The sixth assembly pad PD6 is a pad for applying voltage to the plurality of second assembly wirings 122 disposed in the plurality of blue sub-pixels SPB on the mother substrate 10.

Through these plurality of assembly pads (PD), the light emitting device (LED) can be selectively self-assembled only in a specific subpixel (SP) among the plurality of subpixels (SP). For example, when self-assembling the light emitting device (LED) only to a plurality of red sub-pixels (SPR), the light-emitting device (LED) is self-assembled to the plurality of red sub-pixels (SPR) through the first assembly pad (PD1) and the fourth assembly pad (PD4). Voltage can be applied only to the plurality of first assembly wirings 121 and the plurality of second assembly wirings 122 arranged.

The assembly wiring connecting portion PL is a wiring connecting the plurality of assembly wirings 120 and the plurality of assembly pads PD on each substrate 110. The assembly wiring connection portion PL has one end connected to a plurality of assembly pads PD and the other end extending onto the plurality of substrates 110 to form a plurality of first assembly wirings 121 and a plurality of second assembly wirings 122. The assembly wiring connection part PL includes a first connection part PL1, a second connection part PL2, a third connection part PL3, a fourth connection part PL4, a fifth connection part PL5, and a sixth connection part PL6.

The first connection portion PL1 is a wiring that electrically connects the first assembly wiring 121 disposed in the plurality of red sub-pixels SPR on the mother substrate 10 and the first assembly pad PD1. The fourth connection part PL4 is a wiring that electrically connects the second assembly wiring 122 and the fourth assembly pad PD4 disposed in the plurality of red sub-pixels SPR on the mother substrate 10. For example, the other end of the first connection part PL1 extends to each of the plurality of substrates 110, and a plurality of first assembly wirings 121 are disposed on and can be electrically connected to the red sub-pixels SPR of each of the plurality of substrates 110. For example, the other end of the fourth connection portion PL4 extends to each of the plurality of substrates 110, and a plurality of second assembly wirings 122 are disposed on and can be electrically connected to the red sub-pixels SPR of each of the plurality of substrates 110.

The second connection portion PL2 is a wiring that electrically connects the first assembly wiring 121 and the second assembly pad PD2 disposed in the plurality of green sub-pixels SPG on the mother substrate 10. The fifth connection portion PL5 is a wiring that electrically connects the second assembly wiring 122 and the fifth assembly pad PD5 disposed in the plurality of green sub-pixels SPG on the mother substrate 10.

The third connection part PL3 is a wiring that electrically connects the first assembly wiring 121 and the third assembly pad PD3 disposed in the plurality of blue sub-pixels SPB on the mother substrate 10. The sixth connection portion PL6 is a wiring that electrically connects the second assembly wiring 122 and the sixth assembly pad PD6 disposed in the plurality of blue sub-pixels SPB on the mother substrate 10.

At this time, the plurality of first assembly wirings 121 disposed on one substrate 110 are connected into one, and the plurality of second assembly wirings 122 are in addition connected into one to form a plurality of first assembly wirings 121 and a plurality of plurality of assembly wirings 121. Each of the second assembly wirings 122 can be easily connected to the assembly wiring connection portion PL.

For example, referring to FIG. 4D, the first assembly wiring 121 disposed in a plurality of red sub-pixels (SPR) on one substrate 110 is a link wiring in the non-display area (NA) of the substrate 110. The second assembly wiring 122, which is connected as one through (LL) and arranged in a plurality of red sub-pixels (SPR), can in addition be connected as one through a link wiring (LL) in the non-display area (NA) of the substrate 110. In this case, each of the plurality of first assembly wirings 121 and the plurality of second assembly wirings 122 disposed on one substrate 110 are not individually connected to the assembly wiring connecting portion PL, and the non-display area In (NA), a link wiring (LL) connecting each of the plurality of first assembly wirings 121 and a plurality of second assembly wirings 122 into one and an assembly wiring connection portion (PL) are connected to form a plurality of first assembly wirings 121 and the plurality of second assembly wirings 122, a voltage for self-assembly of the light emitting device (LED) can be easily applied.

Meanwhile, the assembly wiring connection portion PL can be formed of the same material and the same process as the plurality of assembly wiring 120, or can be formed of different materials and processes. Additionally, the assembly wiring connection part PL can have a single-layer structure or a multi-layer structure, but is not limited thereto.

In addition, the assembly wiring connection portion (PL) and assembly pad (PD) shown in FIGS. 4C and 4D are exemplary, and the arrangement and shape of the assembly wiring connection portion (PL) and assembly pad (PD) and the number or sequence of the self-assembly process, can vary depending on the design of the plurality of sub-pixels (SP).

Next, referring to FIGS. 4E and 4F, after the self-assembly process of the plurality of light emitting devices (LEDs) is completed, the mother substrate 10 is cut along the scribing line (SCL) to form the plurality of substrates 110 and can be separated. In addition, when scribing the mother substrate 10, a portion of the assembly wiring connecting portion PL connecting the plurality of assembly wirings 120 and the plurality of assembly pads PD at the edge of the substrate 110 can be cut. Accordingly, the cut surface of the assembly wiring connection portion PL can be confirmed on the cut surface of the substrate 110.

For example, in area X of FIG. 4E, a cross section of the substrate 110 and a cross section of the plurality of insulating layers IL disposed to form a driving circuit or a plurality of wirings on the substrate 110 and a cross section of the assembly wiring connection portion PL disposed between the plurality of insulating layers IL can be confirmed. A first connection portion PL1 connecting the first assembly wiring 121 of the plurality of red sub-pixels (SPR) between the plurality of insulating layers IL, and the first assembly wiring 121 of the plurality of green sub-pixels (SPG) and the third connection part PL3 connecting the first assembly wirings 121 of the plurality of blue sub-pixels SPB can be seen.

Next, FIG. 4G is a schematic plan view of the mother substrate 10 provided with a ground pad (GP) outside the display area (AA).

According to the display device according to the embodiment, when designing the display and assembly wiring by DEP, if dielectric materials such as organic films or dielectric films exist around wiring to which voltage signals are applied, they can have a capacitor structure, and internal research has shown that such capacitor structures can have characteristics that disturb or interfere with voltage signals.

And it was studied that this capacitor structure can reduce the mobility of Micro LED chips depending on the location.

For example, the interference characteristics of the capacitor can disturb the voltage signal used in DEP assembly and cause a decrease in assembly rate, so it should be considered when designing the display and assembly structure.

Accordingly, the inventors of the embodiment would like to propose structures that can function as a capacitor structure and a discharge structure in the structure. According to internal technology, self-assembly wiring design using DEP can include a capacitor structure.

For example, when designing an active or passive display, the entire electrode structure can include data lines, scan lines, and power supply lines, and additional assembly wiring can be formed.

At this time, since most of the wiring forms a Via structure with vertical insulating layers, a capacitor structure can be formed in the overlapping area.

Accordingly, the voltage signal applied to the assembly wiring can induce a floating voltage signal in the surrounding wiring and charge the capacitor structures, and the charged capacitor structure can disturb the assembly signal, affecting the assembly rate and Micro LED chip cluster mobility. Referring to FIG. 4G, in the embodiment, a grounding pad GP can be provided outside the display area AA. Each of the plurality of substrates is electrically connected by an assembly wiring connection portion PL.

Specifically, according to the embodiment, the grounding pad (GP) can be connected to one side other than the side connected to the assembly wiring connection portion (PL). In this case, there is a technical effect in that parasitic capacitance existing in the mother substrate 10 can be removed by the grounding pad GP.

In addition, according to the embodiment, there is a special technical effect of relieving the voltage signal of the capacitor by designing a structure that connects wiring that can affect the ground to the ground pad (GP) outside the display active area.

Next, after scribing the mother substrate 10 to separate it into a plurality of substrates 110, a link wiring LL connecting the plurality of first assembly wirings 121 into one and a plurality of second assembly wirings. The same voltage can be easily applied to the plurality of first assembly wirings 121 and the plurality of second assembly wirings 122 through the link wiring LL connecting the wirings 122. For example, when driving the display device 100, the link wiring LL connecting each of the plurality of first assembly wirings 121 and the plurality of second assembly wirings 122 into one in the non-display area NA is driven. By connecting the IC, voltage can be applied to the plurality of first assembly wirings 121 and the plurality of second assembly wirings 122.

In the display device 100 according to the embodiment, at least some of the plurality of assembly wirings 120 for self-assembly of the plurality of light emitting devices (LEDs) can be used as wiring for applying a low-potential power supply voltage to the plurality of light emitting devices (LEDs). When manufacturing the display device 100, a plurality of light emitting devices (LEDs) floating in the fluid WT can be moved adjacent to the mother substrate 10 using a magnetic field.

Next, different voltages can be applied to the plurality of first assembly wirings 121 and the plurality of second assembly wirings 122 to form an electric field, and a plurality of light emitting devices (LEDs) can be self-assembled within the plurality of first openings 117*a* by an electric field. At this time, instead of separately forming a wiring that supplies a low-potential voltage and connecting it to a plurality of self-assembled light emitting devices (LEDs), by bonding the first electrode 134 of the light emitting device (LED) to the second assembly wiring 122, a portion of which is exposed within the first opening 117*a*, when driving the display device 100, a plurality of assembly wirings 120 can be used as wiring for supplying low-potential voltage to a plurality of light emitting devices (LEDs). Therefore, in the display device 100 according to the embodiment, there is a technical effect in that the plurality of assembly wirings 120 can be used not only for self-assembly of the plurality of light emitting devices (LEDs) but in addition as wiring for driving the plurality of light emitting devices (LEDs).

In the display device 100 according to the embodiment, the plurality of assembly wirings 120 include a clad layer, so that corrosion of the plurality of assembly wirings 120 or short circuit defects can be reduced. The plurality of first assembly wirings 121 can include a first conductive layer 121*a* and a first clad layer 121*b* surrounding the first conductive layer 121*a* and being more resistant to corrosion than the first conductive layer 121*a*.

Additionally, the plurality of second assembly wirings 122 can include a second conductive layer 122*a* and a second clad layer 122*b* that surrounds the second conductive layer 122*a* and is more resistant to corrosion than the second conductive layer 122*a*.

When manufacturing the display device 100, a plurality of light emitting devices (LEDs) can be self-assembled by placing the mother substrate 10 on which a plurality of assembly wirings 120 are formed in the fluid WT. In this case, the first conductive layer 121*a* and/or the second conductive layer 122*a* can be exposed in the fluid WT and the assembly wiring 120 can be corroded, which can cause a short circuit defect. Therefore, the first conductive layer 121*a* of the plurality of first assembly wirings 121 can be wrapped with the second passivation layer 115 and the first clad layer 121*b*, and the second conductive layer 122*a* of the plurality of second assembly wirings 122 can be wrapped with the third passivation layer 116 and the second clad layer 122*b*. Accordingly, the plurality of assembly wirings 120 are formed in a structure including the first clad layer 121*b* and the second clad layer 122*b*, thereby improving the reliability of the plurality of assembly wirings 120.

Next, FIG. 5 is a cross-sectional view of a display device according to the second embodiment. The display device 500 of FIG. 5 is different from the display device 100 of FIG. 3 only in the plurality of assembly wirings 520, and other configurations are substantially the same, so duplicate descriptions will be omitted.

Referring to FIG. 5, the first conductive layer 521*a* of the plurality of first assembly wirings 521 and the second conductive layer 522*a* of the plurality of second assembly wirings 522 can overlap the second planarization layer 117. The second planarization layer 117 can cover the first conductive layer 521*a* of the plurality of first assembly wirings 521 and the first conductive layer 521*a* of the plurality of second assembly wirings 522, and the first conductive layer 521*a* and the second conductive layer 522*a* can be spaced apart from the first opening 117*a*.

The first clad layer 521*b* of the plurality of first assembly wirings 521 can be disposed between the first conductive layer 521*a* and the second planarization layer 117 to cover the first conductive layer 521*a*. And instead of the first conductive layer 521*a* that does not overlap the first opening 117*a*, the first clad layer 521*b* extends toward the first opening 117*a*, thereby forming an electric field for self-assembly of a plurality of light emitting devices (LEDs).

A portion of the first clad layer 521*b* can overlap the second planarization layer 117 and cover the top and side surfaces of the first conductive layer 521*a*. Additionally, the remaining portion of the first clad layer 521*b* can extend inside the first opening 117*a* and overlap a plurality of light emitting devices (LEDs). However, since the third passivation layer 116 is disposed on the first clad layer 521*b*, the first clad layer 521*b* may not be in contact with the first electrode 134 of the plurality of light emitting devices (LEDs).

The second clad layer 522*b* of the plurality of second assembly wirings 522 can be disposed between the second conductive layer 522*a* and the second planarization layer 117 to cover the second conductive layer 522*a*. And instead of the second conductive layer 522*a* that does not overlap the first opening 117*a*, the second clad layer 522*b* extends toward the first opening 117*a*, and can form an electric field for self-assembling a plurality of light emitting devices (LEDs) together with the first clad layer 521*b*.

A portion of the second clad layer 522*b* can overlap the second planarization layer 117 and cover the top and side surfaces of the second conductive layer 522*a*. The remaining portion of the second clad layer 522*b* can extend inside the first opening 117*a* and overlap a plurality of light emitting devices (LEDs). At this time, since the second clad layer 522*b* is disposed on the third passivation layer 116, the second clad layer 522*b* and the first electrode 134 of the plurality of light emitting devices (LEDs) can contact each other, there is a technical effect of being able to supply a low-potential power supply voltage from the second assembly wiring 522 to a plurality of light emitting devices (LEDs).

In the display device 500 according to the second embodiment, a plurality of clad layers are exposed to extend inside the first opening 117*a*, there is a technical effect of minimizing corrosion and short circuit defects in the first conductive layer 521*a* and the second conductive layer 522*a*. The plurality of first assembly wirings 521 include a first conductive layer 521*a* and a first clad layer 521*b* that is more resistant to corrosion than the first conductive layer 521*a*, and the plurality of second assembly wirings 522 include a second conductive layer 522*a* and a second clad layer 522*b* that is more resistant to corrosion than the second conductive layer 522*a*.

At this time, the first clad layer (521*b*), the second clad layer (522*b*), and the second planarization layer 117 are formed to cover the first conductive layer (521*a*) and the second conductive layer (522*a*), the first conductive layer 521*a* and the second conductive layer 522*a* can be prevented from being exposed to the fluid WT.

And the first clad layer 521*b* and the second clad layer 522*b* extend inside the first opening 117*a*, forming an electric field that induces self-assembly of the light emitting device (LED). In addition, since the first conductive layer 521*a* and the second conductive layer 522*a* do not overlap the first opening 117*a* where the light emitting device is self-assembled, the thickness of the substrate can be reduced.

Additionally, after self-assembly is completed, by bonding the first electrode 134 of the light emitting device (LED) on the second clad layer 522*b* extending inside the first opening 117*a*, the second assembly wiring 522 and the light emitting device (LED) can be electrically connected. Therefore, in the display device 500 according to another embodiment, the first clad layer 521*b* and the second clad layer 522*b* of each of the plurality of assembly wirings 520 are disposed in the first opening 117*a* to minimize corrosion and short circuit defects of the plurality of assembly wirings 520.

In the display device 500 according to the second embodiment, since The first clad layer 521*b* and the second clad layer 522*b* vertically overlap the light emitting device 130, and the first conductive layer 521*a* and the second conductive layer 522*b* do not overlap perpendicularly with the light emitting device 130, so that the thickness of the display panel can be reduced.

In the display device 500 according to the second embodiment, the bonding process of the plurality of light emitting devices (LEDs) can be easily performed with a low step difference between the first clad layer 521*b* and the second clad layer 522*b* in the first opening 117*a*.

Specifically, a first clad layer 521*b* and a second clad layer 522*b* among the plurality of assembly wirings 520 can be disposed within the first opening 117*a* where the plurality of light emitting devices (LEDs) are seated.

At this time, the first clad layer (521*b*) and the second clad layer (522*b*) have a thinner thickness than the first conductive layer (521*a*) and the second conductive layer (522*a*). Accordingly, the level difference can be reduced when only the first clad layer 521*b* and the second clad layer 522*b* are disposed, compared to when both the first conductive layer 521*a*, the first clad layer 521*b*, the second conductive layer 522*a*, and the second clad layer 522*b* is disposed.

Therefore, when a plurality of light emitting devices (LEDs) are located within the first opening 117*a*, it is possible to minimize cases where the gap between a plurality of light-emitting devices (LEDs) and the first clad layer 521*b*, that is, when a plurality of light-emitting devices (LEDs) are arranged in an unstable state floating in an empty space on the first clad layer (521*b*), and a plurality of light emitting devices (LEDs) can be stably bonded on the second clad layer 522*b*. Therefore, in the display device 500 according to another embodiment, there is a technical effect in that a plurality of light emitting devices (LEDs) can be stably bonded to the second assembly wiring 522 by reducing the step between the plurality of assembly wirings 520 overlapping in the first opening 117*a*.

Next, FIG. 6 is a cross-sectional view of a display device according to the third embodiment. The display device 600 of FIG. 6 is different from the display device 500 according to the second embodiment of FIG. 5 only in the plurality of assembly wirings 620, but other configurations are substantially the same, so duplicate descriptions are omitted.

Referring to FIG. 6, the first conductive layer 621*a* of the first assembly wiring 621 is disposed between the second passivation layer 115 and the third passivation layer 116, a first clad layer 621*b* is disposed between the first conductive layer 621*a* and the second passivation layer 115. The first clad layer 621*b* can be in contact with the lower surface of the first conductive layer 621*a*.

A portion of the first clad layer 621*b* is in contact with the lower surface of the first assembly wiring 621 and can overlap the second planarization layer 117. The remaining portion of the first clad layer 621*b* can extend inside the first opening 117*a* and overlap the light emitting device (LED).

The second conductive layer 622*a* of the second assembly wiring 622 can be disposed on the third passivation layer 116, and the second clad layer 622*b* can be disposed under the third passivation layer 116. Accordingly, the third passivation layer 116 can be disposed between the second clad layer 622*b* and the second conductive layer 622*a*. The second clad layer 622*b* is disposed below the second conductive layer 622*a* and can be electrically connected to the second conductive layer 622*a* through a contact hole formed in the third passivation layer 116.

The first clad layer 621*b* is made of a material that is more resistant to corrosion than the first conductive layer 621*a*, when manufacturing the display device 600, short circuit defects due to migration between the first conductive layer 621*a* of the first assembly wiring 621 and the second conductive layer 622*a* of the second assembly wiring 622 can be minimized. For example, the first clad layer 621*b* can be made of molybdenum (Mo), molybdenum titanium (MoTi), etc., but is not limited thereto.

A portion of the second clad layer 622*b* can overlap the second conductive layer 622*a* and the second planarization layer 117 at the same time. The remaining portion of the second clad layer 622*b* extends inside the first opening 117*a* and can be electrically connected to the light emitting device (LED).

At this time, in order to bond a plurality of light emitting devices (LEDs) to the second clad layer 622*b* inside the first opening 117*a*, an opening can be formed in the third passivation layer 116 covering the second clad layer 622*b*. Specifically, both the first clad layer 621*b* and the second clad layer 622*b* can be disposed under the third passivation layer 116. And, except for the part covering the first clad layer 621*b*, of the third passivation layer 116 exposed through the first opening 117*a*, the remaining part can be opened to expose the second clad layer 622*b*, and the first electrodes 134 of the plurality of light emitting devices (LEDs) can be electrically connected only to the second clad layer 622*b*.

In addition, the second clad layer 622*b* vertically overlaps the light emitting device 130, and the second conductive layer 622*a* can be disposed in the same horizontal direction as the light emitting device 130 to reduce the thickness of the display device 600.

Meanwhile, both the first clad layer 621*b* and the second clad layer 622*b* can be disposed on the same plane. For example, the first clad layer 621*b* and the second clad layer 622*b* can be disposed on the upper surface of the second passivation layer 115. The first clad layer 621*b* and the second clad layer 622*b* can be formed through the same process and can be formed of the same material on the same plane.

In the display device 600 according to the third embodiment, the first clad layer 621*b* and the second clad layer 622*b* are disposed on the same plane, so that the gap between the first clad layer 621*b* and the second clad layer 622*b* can be precisely controlled. When the first clad layer 621*b* of the first assembly wiring 621 and the second clad layer 622*b* of the second assembly wiring 622 are formed using the same material and the same process, the first clad layer 621*b* and the second clad layer 622*b* can be disposed on the same plane.

At this time, a conductive material layer is formed on the second passivation layer 115, and the conductive material layer is patterned using one mask, the gap between the first clad layer 621*b* and the second clad layer 622*b* can be easily controlled. If the first clad layer 621*b* and the second clad layer 622*b* are formed using different mask processes, due to the error range in each mask process, a problem can arise where it is difficult to precisely control the gap between the first clad layer 621*b* and the second clad layer 622*b* and short circuit defect between the first clad layer (621*b*) and the second clad layer (622*b*), etc.

Therefore, in the display device 600 according to the third embodiment, the first clad layer 621*b* and the second clad layer 622*b* are formed on the same plane with the same material, so that there is a technical effect of being able to precisely control the gap between the first clad layer 621*b* and the second clad layer 622*b* and controlling the electric field for self-assembly of the light emitting device (LED).

Next, FIGS. 7A and 7B are cross-sectional views of a display device according to the fourth embodiment. The display device 700 of FIGS. 7A and 7B does not include the third passivation layer 116 compared to the display device 100 of FIG. 3, and only has a plurality of assembly wirings 720 that are different. Since other configurations are substantially the same, redundant description will be omitted.

Referring to FIG. 7A, in the fourth embodiment, the first conductive layer 721*a* of the first assembly wiring 721 and the second conductive layer 722*a* of the second assembly wiring 722 are disposed on the second passivation layer 115. The first conductive layer 721*a* and the second conductive layer 722*a* can be disposed on the same plane.

A first clad layer (721*b*) covering the first conductive layer (721*a*) can be disposed on the first conductive layer (721*a*), and a second clad layer 722*b* covering the second conductive layer 722*a* can be disposed on the second conductive layer 722*a*. The first clad layer 721*b* can cover the top and side surfaces of the first conductive layer 721*a*, and the second clad layer 722*b* can cover the top and side surfaces of the second conductive layer 722*a*.

And the second planarization layer 117 can be arranged to cover the first clad layer 721*b*, the first conductive layer 721*a*, the second clad layer 722*b*, and the second conductive layer 722*a*. The second planarization layer 117 can be disposed to cover at least a portion of the first clad layer 721*b* and at least a portion of the second clad layer 722*b*. A portion of the first clad layer 721*b* and a portion of the second clad layer 722*b* can be exposed through the first opening 117*a* of the second planarization layer 117.

Meanwhile, the thickness T2 of the second assembly wiring 722 can be thicker than the thickness T1 of the first assembly wiring 721, and the top surface of the second assembly wiring 722 can be disposed higher than the top surface of the first assembly wiring 721.

When forming the second assembly wiring 722 thicker than the first assembly wiring 721, it can be difficult for the light emitting device (LED) to contact the first assembly wiring 721 below the second assembly wiring 722. Therefore, the second thickness T2 of the second assembly wiring 722 is formed to be thicker than the first thickness T1 of the first assembly wiring 721, there is a technical effect in that the light emitting device (LED) can be easily bonded only on the second assembly wiring 722.

A portion of the first assembly wiring 721 and a portion of the second assembly wiring 722 can overlap the first opening 117*a*. A sum of the width (A) of the first assembly wiring 721 overlapping the first opening 117*a* and the width (B) between the first assembly wiring 721 and the second assembly wiring 722 in the first opening 117*a* can be smaller than the minimum height (C) of the light emitting device (LED).

That is, the sum of the width (A) of the first clad layer (721*b*) overlapping the first opening (117*a*) and the gap (B) between the first clad layer (721*b*) and the second clad layer (722*b*) can be smaller than the minimum height (C) of the light emitting device (LED).

In this case, because the minimum height of the plurality of light emitting devices (LED) is at least greater than the gap between the second assembly wiring 722 and the side wall of the first opening 117*a*, there is a technical effect that it is difficult to completely insert a plurality of light emitting devices (LEDs) into the empty space above the first assembly wiring 721.

Even if a plurality of light emitting devices (LEDs) are self-assembled in an inclined state within the first opening 117*a*, as shown in FIG. 7B, there is a technical effect in that the plurality of light emitting devices (LEDs) do not come into contact with the first assembly wiring 721. Accordingly, even if a separate insulating layer is not formed to cover a portion of the first assembly wiring 721 overlapping the first opening 117*a*, there is a technical effect in that only the second assembly wiring 722 among the first assembly wiring 721 and the second assembly wiring 722 can be electrically connected to the light emitting device (LED).

Referring to FIGS. 7A and 7B, in the process of bonding the light emitting devices (LEDs) to the second assembly wiring 722 by applying heat and pressure to the plurality of light emitting devices (LEDs), some of the plurality of light emitting devices (LEDs) can be bonded in a flat state on the second assembly wiring 722 as shown in FIG. 7A. Additionally, some of the plurality of light emitting devices (LEDs) can be bonded in an inclined state on the second assembly wiring 722 as shown in FIG. 7B.

On the other hand, when a plurality of light emitting devices (LEDs) are self-assembled in the first opening 117*a* in an inclined state as shown in FIG. 7B, a case can occur where a plurality of light emitting devices (LEDs) contact both the first assembly wiring 721 and the second assembly wiring 722. The first clad layer 721*b* of the first assembly wiring 721 can be made of a material that can induce a cold soldering phenomenon. Cold soldering refers to a phenomenon in which solder falls off when it is not soldered properly and is exposed to heat or shock.

Even if the first clad layer 721*b* and the light emitting device (LED) contact during the process of self-assembling and bonding a plurality of light emitting devices (LED), the first clad layer 721*b* is formed of a material that is prone to cold soldering, and there is a technical effect in that the first clad layer 721*b* and the light emitting device (LED) can be separated, and electrical connection between the first assembly wiring 721 and the light emitting device (LED) can be minimized. The first clad layer 721*b* can be made of, for example, a transparent conductive oxide, but is not limited thereto.

In the display device 700 according to the fourth embodiment, the second thickness T2 of the second assembly wiring 722 is formed to be thicker than the first thickness T1 of the first assembly wiring 721, so that there is a technical effect in that the light emitting device (LED) can be easily bonded to the second assembly wiring 722 without a separate insulating layer covering the first assembly wiring 721.

When forming the second thickness T2 of the second assembly wiring 722 to be thicker than the first thickness T1 of the first assembly wiring 721, a plurality of light emitting devices (LEDs) self-assembled within the first opening 117*a* can first contact and be bonded to the second assembly wiring 722 among the first assembly wiring 721 and the second assembly wiring 722. In addition, when a plurality of light emitting devices (LEDs) are self-assembled in an inclined state and disposed in the space between the second assembly wiring 722 and the side wall of the first opening 117*a*, due to the second thickness of the second assembly wiring 722, it can be difficult for the first electrode 134 of the light emitting device (LED) to contact the first assembly wiring 721.

Accordingly, there is a technical effect of preventing the light emitting device (LED) and the first assembly wiring 721 from contacting each other in the first opening 117*a* without an insulating layer covering the first assembly wiring 721.

In addition, the minimum height (C) of the light emitting device (LED) is formed to be greater than the sum of width (A) of the first assembly wiring 721 exposed in the first opening 117*a* and widths (B) between the first assembly wiring 721 and the second assembly wiring 722, so that there is a technical effect of preventing a plurality of light emitting devices (LEDs) from being inserted into the empty space above the first assembly wiring 721 during self-assembly.

Accordingly, in the display device 700 according to the fourth embodiment, the second thickness T2 of the second assembly wiring 722 is formed to be thicker than the first thickness T1 of the first assembly wiring 721, so that there is a technical effect that the insulating layer covering the first assembly wiring 721 can be simplified and a plurality of light emitting devices (LEDs) can be easily bonded only to the second assembly wiring 722.

Next, FIG. 8A is a cross-sectional view of a display device according to the fifth embodiment. The display device 800 of FIG. 8A is different from the fourth display device 700 of FIG. 7 only in the second planarization layer 817, and other configurations are substantially the same, so duplicate descriptions will be omitted.

Referring to FIG. 8A, the second planarization layer 817 can include a protrusion 817*a*. The protrusion 817*a* of the second planarization layer 817 is a portion extending inside the first opening 117*a* from the lower portion of the side wall forming the first opening 117*a*, and can cover a portion of the first clad layer 721*b* of the first assembly wiring 721 and a portion of the second clad layer 722*b* of the second assembly wiring 722.

The angle of the side wall of the second planarization layer 817 in the first opening 117*a* with respect to the upper surface of the first assembly wiring 721 can be greater than the angle of the protrusion 817*a*. For example, the angle of the sidewall of the second planarization layer 817 with respect to the upper surface of the first assembly wiring 721 can be approximately 70° or more, and can be formed close to vertical. The angle of the top and side surfaces of the protrusion 817*a* with respect to the top surface of the first assembly wiring 721 can have a gentle slope of about 30° or less.

When the protrusion 817*a* extending from the lower part of the side wall of the second planarization layer 817 is self-assembled in an inclined state within the first opening 117*a*, a plurality of light emitting devices (LEDs), electrical connection of the light emitting device (LED) with the first assembly wiring 721 can be minimized.

According to the fifth embodiment, a protrusion 817*a* is formed on the first assembly wiring 721 adjacent to the side wall of the first opening 117*a*, so that the light emitting device (LED) can be separated from the first assembly wiring 721 exposed through the first opening 117*a* and electrically connected only to the second assembly wiring 722.

At this time, the protrusion 817*a* of the second planarization layer 817 can be formed by changing the process conditions when forming the plurality of first openings 117*a* in the second planarization layer 817. For example, when forming a plurality of first openings 117*a* through a photolithography process, during exposure, light that passes through the mask and is irradiated to the second planarization layer 817 can be reflected and scattered in the first assembly wiring 721 and the second assembly wiring 722 under the first opening 117*a*.

Accordingly, during development, by light reflected and scattered near the surfaces of the first assembly wiring 721 and the second assembly wiring 722, it can be difficult to remove the material forming the second planarization layer 817 from the lower sidewall portion of the first opening 117*a*. Accordingly, by using the phenomenon of light being reflected and scattered on the surface of the first assembly wiring 721 and the second assembly wiring 722 made of a metal material, a protrusion 817*a* can be formed protruding from the lower sidewall of the first opening 117*a*.

According to the display device 800 according to the fifth embodiment, there is a technical effect of preventing the first assembly wiring 721 and the light emitting device (LED) from being electrically connected by forming the protrusion 817*a* protruding from the first opening 117*a*. The plurality of protrusions 817*a* are portions that protrude from the lower side wall of the first opening 117*a*, a portion of the upper surface of the first assembly wiring 721 and a portion of the upper surface of the second assembly wiring 722 adjacent to the sidewall of the first opening 117*a* can be covered.

For example, when self-assembling a plurality of light-emitting devices (LEDs), if the plurality of light-emitting devices (LEDs) are self-assembled in an inclined state, a portion of the light emitting device (LED) can be disposed in the space where the first assembly wiring 721 is disposed, so that the first assembly wiring 721 and the light emitting device (LED) can be electrically connected.

To prevent this, a protrusion 817*a* is formed to cover the upper surface of the first assembly wiring 721 adjacent to the side wall of the first opening 117*a*, it is possible to prevent the plurality of light emitting devices (LEDs) and the plurality of first assembly wirings 721 from coming into contact with each other. Accordingly, in the display device 800 according to the fifth embodiment, instead of forming a separate insulating layer covering the plurality of first assembly wirings 721, a protrusion 817*a* is formed protruding from the second planarization layer 817, there is a technical effect of being able to separate the plurality of first assembly wirings 721 and the plurality of light emitting devices (LEDs).

Next, FIG. 8B is a cross-sectional view of the display device according to the sixth embodiment. The display device 800 of FIG. 8B is different from the display device 800 according to the fifth embodiment of FIG. 8A only in the second-second protrusion 817*b*, and other configurations are substantially the same, so duplicate description is omitted.

Referring to FIG. 8B, the second planarization layer 817 can include a second-second protrusion 817*b*.

The second-second protrusion 817*b* of the second planarization layer 817 can cover a portion of the first clad layer 721*b* of the first assembly wiring 721 and can cover a portion of the second clad layer 722*b* of the second assembly wiring 722.

The upper surface of the second-second protrusion 817*b* can be formed flat. Accordingly, the second-second protrusion 817*b* in addition contacts the lower surface of the light emitting device 130, which has the technical effect of allowing the light emitting device to be stably supported without tilting during self-assembly.

In addition, the second-second protrusion 817*b* has the effect of dissipating heat generated from the light emitting device 130, the first assembly wiring 721, and the second assembly wiring 722 into the insulating layer.

Next, FIG. 9A is a cross-sectional view of a display device according to the seventh embodiment. The display device 900 of FIG. 9A is compared to the display device 500 of FIG. 5, only the first clad layer 821*b*, the second clad layer 822*b*, and the electrode hole 823 are different, and other configurations are substantially the same, so duplicate descriptions will be omitted.

According to undisclosed internal technology, DEP Force is required for self-assembly, but due to the difficulty in uniformly controlling the DEP Force, problems occur where the light-emitting device is tilted or tilted to an incorrect position within the assembly hall when assembling using self-assembly.

In addition, there is a problem that the electrical contact characteristics are deteriorated in the electrical contact process due to tilting or tilting of the light emitting device, resulting in a decrease in the lighting rate.

Therefore, according to undisclosed internal technology, DEP Force is required for self-assembly, but when DEP Force is used, it faces a technical contradiction in that the electrical contact characteristics are deteriorated due to the tilting phenomenon of the semiconductor light emitting device.

For example, in the assembled electrode structure according to the internal technology, a passivation layer, which is an insulating film, is interposed between the first assembled electrode and the second assembled electrode, and self-assembly is in progress with only one of them exposed. However, since the assembled electrode structure is asymmetric, the electric field distribution is in addition asymmetric, which can be biased to one side when assembling a semiconductor light emitting device, and as the bonding area between the assembled electrode exposed to the insulating film and the bonding metal of the light emitting device is small, it becomes difficult to apply a signal as the light emitting chip becomes smaller.

Referring to FIG. 9A, the first clad layer 821*b* is disposed on the second passivation layer 115 and covers the first conductive layer 821*a*, and can extend in the direction of the second conductive layer 822*a* and the second clad layer 822*b*.

In addition, the second clad layer 822*b* is disposed on the third passivation layer 116, and covers the second conductive layer 822*a* and a portion can extend in the direction of the first conductive layer 821*a* and the first clad layer 821*b*.

In the seventh embodiment, the first clad layer 821*b* and the second clad layer 822*b* are disposed with the third passivation layer 116 between them, so that they can overlap top and bottom.

Meanwhile, the second clad layer 822*b* can have a predetermined electrode hole 823 in an area overlapping with the light emitting device 130 and the first clad layer 821*b*. The size of the electrode hole 823 can be smaller than the size of the light emitting device 130.

Additionally, an alternating current voltage can be applied to the first clad layer 821*b* and the second clad layer 822*b* to generate an electric field. The DEP force caused by this electric field can be concentrated in the electrode hole 823 provided in the second clad layer 822*b*.

For example, referring to FIG. 9B, the light emitting device 130 can be self-assembled within the first opening 117*a* by a dielectrophoretic force (DEP force) generated by the electric field of the first clad layer 821*a* and the second clad layer 822*b*.

Meanwhile, the second clad layer 822*b* can be disposed below the light emitting device 130. Additionally, the second clad layer 822*b* can be in contact with the first electrode 134 of the light emitting device 130.

Therefore, as the second clad layer 822*b* is disposed on the lower surface of the first electrode 134 of the light emitting device 130, the light emitting device 130 is supported uniformly.

Next, FIG. 10 is a perspective view showing in detail the assembly wiring 821, 822 and DEP force shown in FIG. 9B.

In the seventh embodiment, a portion of the first clad layer 821*b* and a portion of the second clad layer 822*b* can overlap top and bottom. For example, the first clad layer 821*b* can include a first-first clad layer 821*b*1 and a first-second clad layer 821*b*2.

The first-second clad layer 821*b*2 can be a protruding electrode extending from the first-first clad layer 821*b*1 toward the second clad layer 822*b*.

Additionally, the second clad layer 822*b* can include a second-first clad layer 822*b*1 and a second-second clad layer 822*b*2.

The second-second clad layer 822*b*2 can be a protruding electrode extending from the second-first clad layer 822*b*1 toward the first clad layer 821*b*.

At this time, the first-second clad layer 821*b*2 and the second-second clad layer 822*b*2 can vertically overlap.

Additionally, the second-second clad layer 822*b*2 can include an electrode hole 823.

The electric field generated by the first clad layer 821*b* and the second clad layer 822*b* is concentrated on the electrode hole 823 formed in the second clad layer 822*b* to form a DEP force. The assembly force of the light emitting device 130 can be strengthened by concentrated DEP force.

According to the seventh embodiment, the first clad layer 821*b* of the first assembled electrode and the second clad layer 822*b* of the second assembled electrode are arranged to overlap vertically, the second clad layer 822*b* of the second assembled electrode can have an electrode hole 823.

Accordingly, the DEP force can be concentrated and formed in the electrode hole 823 of the second clad layer 822*b*, and the Dep force is distributed uniformly at the assembly hole center, which has the technical effect of improving the correct assembly rate.

For example, according to the seventh embodiment, the first clad layer 821*b* of the first assembled electrode and the second clad layer 822*b* of the second assembled electrode having the electrode hole 823 are arranged to overlap vertically, there is a special technical effect that can evenly concentrate the strong DEP force on the center inside the assembly hall.

In addition, according to the seventh embodiment, since the effective electrode area of the mutually overlapping cladding layers is large, the capacitance of the assembly electrode is improved and the DEP force is large, so there is a technical effect in that the strong DEP force can be uniformly concentrated on the assembly hole center.

The display device including the semiconductor light-emitting device according to the above-described embodiment has the technical effect of utilizing self-assembly wiring as a wiring for driving the light-emitting device.

In addition, the embodiment has the technical effect of minimizing defects during self-assembly or bonding of light-emitting devices by forming various structures of a plurality of assembly wirings.

Additionally, the embodiment has the technical effect of minimizing corrosion and short circuit defects in a plurality of assembly wiring. For example, the embodiment can prevent corrosion of the conductive layer by using a clad layer that is resistant to corrosion.

Additionally, the embodiment has the technical effect of precisely controlling the spacing between a plurality of assembly wirings.

Additionally, the embodiment has the technical effect of stably bonding a plurality of light-emitting devices by reducing the step between the plurality of assembly wirings. In addition, the embodiment has the technical effect of forming a protrusion in the planarization layer to overcome the step between the plurality of assembly wirings and stably bonding the light emitting device.

In addition, the embodiment has the technical effect of simplifying the insulating layer covering the first assembly wiring and easily separating the first assembly wiring and the light emitting device.

In addition, the embodiment has the technical effect of strengthening the assembly force for the light emitting device by arranging a plurality of assembly wirings in a vertically symmetrical structure.

Additionally, the embodiment has the technical effect of eliminating parasitic capacitance through a grounding pad.

Additionally, the embodiment has the technical effect of reducing the thickness of the panel substrate. For example, in the embodiment, the thickness of the panel substrate can be reduced by extending the clad layer in the horizontal direction of the conductive layer and overlapping the clad layer over the opening where the light emitting device is assembled.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

EXPLANATION OF REFERENCES

10: Mother substrate
AA: Display area
NA: Non-display area
SP: Sub pixel
SPR: Red sub-pixel
SPG: Green sub-pixel
SPB: Blue sub-pixel
100, 500, 600, 700, 800, 900: Display device
110: Substrate
111: Buffer layer
112: Gate insulating layer
113: First passivation layer
114: First planarization layer
115: Second passivation layer
116: Third passivation layer
117, 817: Second planarization layer
117*a*: First opening
117*b*: Second opening
817*a*: Protrusion
817*b*: Second protrusion
118: Third planarization layer
119: Protective layer
120, 520, 620, 720, 820: Assembly wiring
121, 521, 621, 721, 821: First assembly wiring
121*a*, 521*a*, 621*a*, 721*a*, 821*a*: First conductive layer
121*b*, 521*b*, 621*b*, 721*b*, 821*b*: First clad layer
122, 522, 622, 722, 822: Second assembly wiring
122*a*, 522*a*, 622*a*, 722*a*, 822*a*: Second conductive layer
122*b*, 522*b*, 622*b*, 722*b*, 822*b*: Second clad layer
821*b*1: First-first clad layer
821*b*2: First-second clad layer
822*b*1: Second-first clad layer
822*b*2: Second-second clad layer
823: Electrode hole
LED: Light emitting device
130: Red light emitting device
131: First semiconductor layer
132: Emissive layer
133: Second semiconductor layer
134: First electrode
135: Second electrode
140: Green light emitting device
150: Blue light-emitting device
LS: Light blocking layer
SL: Scan wiring
DL: Data wiring
RL: Reference wiring
VDD: High potential power wiring
VDD1: First layer
VDD2: Second layer
VDD3: Third layer
TR1: First transistor
ACT1: First active layer
GE1: First gate electrode
SE1: First source electrode
DE1: First drain electrode
TR2: Second transistor
ACT2: Second active layer
GE2: Second gate electrode
SE2: Second source electrode
DE2: Second drain electrode
TR3: Third transistor
ACT3: Third active layer
GE3: Third gate electrode
SE3: Third source electrode
DE3: Third drain electrode
ST: Storage Capacitor
ST1: First capacitor electrode
ST2: Second capacitor electrode
CE: Connecting electrode
CE1: First connecting layer
CE2: Second connecting layer
PE: Pixel electrode
BM: Black Matrix
CB: Chamber
WT: fluid
MG: Magnet
PD: Assembly Pad
PD1: First assembly pad
PD2: Second assembly pad
PD3: Third assembly pad
PD4: Fourth assembly pad
PD5: Fifth assembly pad
PD6: 6th assembly pad
GP: Ground pad
PL: Assembly wiring connection
PL1: First connection
PL2: Second connection
PL3: Third connection
PL4: Fourth connection
PL5: Fifth connection
PL6: 6th connection
LL: Link wiring SCL: Scribing Line
IL: Plural insulating layers
A: Width of first assembly wiring
B: Width between the first assembly wiring and the second assembly wiring
C: Minimum height of the light emitting device
T1: First thickness of first assembly wiring
T2: Second thickness of second assembly wiring

INDUSTRIAL APPLICABILITY

The embodiment can be adopted in the field of displays that display images or information.

The embodiment can be adopted in the field of displays that display images or information using semiconductor light-emitting devices.

The embodiment can be adopted in the field of displays that display images or information using micro- or nano-level semiconductor light-emitting devices.

The invention claimed is:

1. A display device including a semiconductor light emitting device comprising:

a substrate;

a first assembly wiring and a second assembly wiring alternately arranged on the substrate and spaced apart from each other;

a planarization layer disposed on the first assembly wiring and the second assembly wiring and having a first opening;

a semiconductor light emitting device having a first electrode, disposed inside the first opening, and overlapping the first assembly wiring and the second assembly wiring; and an insulating layer between the first assembly wiring and the first electrode of the semiconductor light emitting device, wherein the first electrode of the semiconductor light emitting device is electrically connected to one of the first assembly wiring and the second assembly wiring, wherein the second assembly wiring is exposed from the insulating layer at the first opening, wherein the first assembly wiring comprises a first conductive layer disposed on the substrate, and a first clad layer in contact with the first conductive layer, wherein the second assembly wiring comprises a second conductive layer disposed on the insulating layer, and a second clad layer in contact with the second conductive layer, and wherein the first electrode of the semiconductor light emitting device is in contact with the second clad layer.

2. The display device including the semiconductor light emitting device according to claim 1, wherein a portion of the first conductive layer, a portion of the first clad layer, a portion of the second conductive layer, a portion of the second clad layer are configured to overlap the first opening, and wherein the second clad layer is disposed on the insulating layer.

3. The display device including the semiconductor light emitting device according to claim 1, wherein the first conductive layer and the second conductive layer are configured to overlap the planarization layer, and wherein a portion of each of the first clad layer and the second clad layer is disposed inside the first opening.

4. The display device including the semiconductor light emitting device according to claim 2, wherein the first clad layer is disposed below the insulating layer, and wherein the second clad layer is disposed on the insulating layer.

5. The display device including the semiconductor light emitting device according to claim 2, wherein the first clad layer and the second clad layer are disposed on the same plane under the insulating layer, and wherein the second clad layer is electrically connected to the second conductive layer on the insulating layer through a contact hole in the insulating layer.

6. The display device including the semiconductor light emitting device according to claim 1, wherein the first assembly wiring and the second assembly wiring are arranged on a same plane.

7. The display device including the semiconductor light emitting device according to claim 6, wherein a portion of the first assembly wiring and a portion of the second assembly wiring overlap the first opening, and wherein a sum of a width of a portion of the first assembly wiring in the first opening and a width between the first assembly wiring and the second assembly wiring in the first opening is smaller than a height of the light emitting device.

8. The display device including the semiconductor light emitting device according to claim 6, further comprising a protrusion configured to protrude from a side wall of the planarization layer in the first opening and configured to cover a portion of the first assembly wiring and a portion of the second assembly wiring.

9. The display device including the semiconductor light emitting device according to claim 1, further comprising a ground pad electrically connected to an active area of the substrate.

10. The display device including the semiconductor light emitting device according to claim 1, wherein the first assembly wiring comprises a first conductive layer and a first clad layer on the first conductive layer, wherein the second assembly wiring comprises a second conductive layer and a second clad layer on the second conductive layer, wherein the first clad layer comprises a first-first clad layer and a first-second clad layer extending from the first-first clad layer, wherein the second clad layer comprises a second-first clad layer and a second-second clad layer extending from the second-first clad layer, and wherein the first-second clad layer and the second-second clad layer are configured to overlap vertically.

11. The display device including the semiconductor light emitting device according to claim 10, wherein the second-second clad layer comprises an electrode hole.

12. A display device including a semiconductor light emitting device comprising:

a substrate;

a first assembly wiring and a second assembly wiring alternately arranged on the substrate and spaced apart from each other;

a planarization layer disposed on the first assembly wiring and the second assembly wiring and having a first opening; and a semiconductor light emitting device having a first electrode, disposed inside the first opening, and overlapping the first assembly wiring and the second assembly wiring, wherein the first electrode of the semiconductor light emitting device is electrically connected to one of the first assembly wiring and the second assembly wiring, wherein the first assembly wiring and the second assembly wiring are arranged on a same plane, wherein the first assembly wiring vertically overlaps the second assembly wiring, and wherein the second assembly wiring comprises an electrode hole in an area vertically overlapping with the first assembly wiring.

13. A display device including a semiconductor light emitting device comprising:

a substrate having a plurality of sub-pixels defined;

a first assembly wiring arranged along a plurality of sub-pixels arranged on a same line among the plurality of sub-pixels;

a second assembly wiring arranged along the plurality of sub-pixels arranged on the same line among the plurality of sub-pixels and adjacent to each of the first assembly wiring; and a planarization layer comprising a first opening and overlapping the first assembly wiring and the second assembly wiring, wherein each of the plurality of sub-pixels comprises a light emitting device disposed in the first opening and electrically connected to the second assembly wiring, wherein the first assembly wiring is configured to vertically overlap the second assembly wiring, and wherein the second assembly wiring comprises an electrode hole in a region vertically overlapping the first assembly wiring.

14. The display device including the semiconductor light emitting device according to claim 13, wherein the light emitting device is bonded to the second assembly wiring at the first opening.

15. The display device including the semiconductor light emitting device according to claim 14, wherein each of the first assembly wirings comprises a first conductive layer and a first clad layer electrically connected to the first conductive layer, wherein each of the second assembly wirings comprises a second conductive layer; and a second clad layer electrically connected to the second conductive layer, and wherein the first conductive layer and the first clad layer are made of different materials, and the second conductive layer and the second clad layer are made of different materials.

16. The display device including the semiconductor light emitting device according to claim 15, further comprising an insulating layer covering the first conductive layer and the first clad layer, wherein the second conductive layer is disposed on the insulating layer, wherein the planarization layer covers the first conductive layer and the second conductive layer, wherein the first clad layer is configured to extend from the first conductive layer to the inside of the first opening, and wherein the second clad layer is configured to extend from the second conductive layer to the inside of the first opening and is configured to contact the plurality of light emitting devices.

17. The display device including the semiconductor light emitting device according to claim 13, further comprising ground pad electrically connected to an active area of the substrate.

* * * * *